(12) United States Patent
Fisher, Jr. et al.

(10) Patent No.: US 12,739,945 B2
(45) Date of Patent: Sep. 15, 2026

(54) VAPORIZER DEVICE HEATER CONTROL

(71) Applicant: JUUL Labs, Inc., Washington, DC (US)

(72) Inventors: Joseph R. Fisher, Jr., Santa Cruz, CA (US); Nicholas J. Hatton, Oakland, CA (US); Andrew L. Murphy, San Francisco, CA (US); Hugh Pham, San Jose, CA (US); Val Valentine, San Francisco, CA (US)

(73) Assignee: JUUL Labs, Inc., Washington, DC (US)

( * ) Notice: Subject to any disclaimer, the term of this patent is extended or adjusted under 35 U.S.C. 154(b) by 213 days.

(21) Appl. No.: 18/228,448

(22) Filed: Jul. 31, 2023

(65) Prior Publication Data

US 2024/0074000 A1 Feb. 29, 2024

Related U.S. Application Data

(63) Continuation of application No. 17/240,895, filed on Apr. 26, 2021, now Pat. No. 11,716,789, which is a (Continued)

(51) Int. Cl.
*H05B 1/02* (2006.01)
*A24F 40/53* (2020.01)

(Continued)

(52) U.S. Cl.
CPC ........... *H05B 1/0244* (2013.01); *A24F 40/53* (2020.01); *H05B 1/0297* (2013.01); *A24F 40/60* (2020.01);

(Continued)

(58) Field of Classification Search
CPC ... A24F 47/008; H05B 1/0297; H05B 1/0244; H05B 1/02; H05B 3/0019; H05B 3/0014;

(Continued)

(56) References Cited

U.S. PATENT DOCUMENTS 3,271,719 A 9/1966 Ovshinsky
4,947,874 A 8/1990 Brooks et al.

(Continued)

FOREIGN PATENT DOCUMENTS

CA 2929379 C 3/2019
CN 1548934 A 11/2004

(Continued)

OTHER PUBLICATIONS (Jun. 15, 2021) How to Measure Resistance—Hioki, https://www.hioki.com/en/learning/methods/resistancemeasurement-methods.html/.

(Continued)

*Primary Examiner* — Danny Nguyen
(74) *Attorney, Agent, or Firm* — Mintz, Levin, Cohn, Ferris, Glovsky and Popeo, P.C.

(57) ABSTRACT

A system includes a current source circuit; a system power input; and load switching circuitry coupling the current source circuit and the system power input to an output configured to couple to a vaporizer heating element. The current source circuit, the system power input, and the load switching circuitry form part of an integrated circuit. Related apparatus, systems, techniques, and articles are also described.

20 Claims, 13 Drawing Sheets

Related U.S. Application Data continuation of application No. 16/449,278, filed on Jun. 21, 2019, now Pat. No. 10,986,875.

(60) Provisional application No. 62/689,774, filed on Jun. 25, 2018.

(51) Int. Cl.

| | |
|---|---|
| *A24F 40/60* | (2020.01) |
| *A24F 47/00* | (2020.01) |
| *F24H 9/00* | (2022.01) |
| *G01R 15/20* | (2006.01) |
| *H02J 7/00* | (2006.01) |
| *H02J 7/62* | (2026.01) |

(52) U.S. Cl.

CPC ............ *A24F 47/00* (2013.01); *F24H 9/0005* (2013.01); *G01R 15/202* (2013.01); *H02J 7/00* (2013.01); *H02J 7/62* (2026.01); *H05B 1/02* (2013.01)

(58) Field of Classification Search

CPC ................... H02J 7/0029; H02J 7/0052; H02J 2007/0039; F24H 9/0005; G01R 15/202

USPC ............................................. 361/86–87, 103

See application file for complete search history.

(56) References Cited

U.S. PATENT DOCUMENTS

| | | | |
|---|---|---|---|
| 4,947,875 | A | 8/1990 | Brooks et al. |
| 5,666,978 | A | 9/1997 | Counts et al. |
| 5,878,752 | A | 3/1999 | Adams et al. |
| 5,894,394 | A | 4/1999 | Baba et al. |
| 6,095,153 | A | 8/2000 | Kessler et al. |
| 6,155,268 | A | 12/2000 | Takeuchi |
| 6,766,220 | B2 | 7/2004 | McRae et al. |
| 7,167,776 | B2 | 1/2007 | Maharajh et al. |
| 7,275,866 | B2 | 10/2007 | Tseng |
| 7,726,320 | B2 | 6/2010 | Robinson et al. |
| 8,794,244 | B2 | 8/2014 | Hammel et al. |
| 8,820,330 | B2 | 9/2014 | Bellinger et al. |
| 8,897,628 | B2 | 11/2014 | Conley et al. |
| D725,310 | S | 3/2015 | Eksouzian |
| 9,155,336 | B2 | 10/2015 | Liu et al. |
| 9,312,687 | B2 | 4/2016 | Xiang |
| 9,364,800 | B2 | 6/2016 | Dubief |
| 9,408,416 | B2 | 8/2016 | Monsees et al. |
| 9,427,022 | B2 | 8/2016 | Levin et al. |
| 9,609,895 | B2 | 4/2017 | Galloway et al. |
| 9,814,263 | B2 | 11/2017 | Cochand et al. |
| 10,130,123 | B2 | 11/2018 | Hatton et al. |
| 10,130,780 | B2 | 11/2018 | Talon et al. |
| 10,131,532 | B2 | 11/2018 | Murison et al. |
| 10,143,233 | B2 | 12/2018 | Dubief et al. |
| 10,188,148 | B2 | 1/2019 | Althorpe et al. |
| 10,244,793 | B2 | 4/2019 | Monsees et al. |
| 10,272,170 | B2 | 4/2019 | Dubief et al. |
| 10,420,374 | B2 | 9/2019 | Liu et al. |
| 10,912,333 | B2 | 2/2021 | Atkins et al. |
| 11,590,296 | B2 | 2/2023 | Hatton et al. |
| 2003/0033055 | A1 | 2/2003 | McRae et al. |
| 2004/0050382 | A1 | 3/2004 | Goodchild |
| 2004/0081624 | A1 | 4/2004 | Nguyen et al. |
| 2006/0047368 | A1 | 3/2006 | Maharajh et al. |
| 2007/0277816 | A1 | 12/2007 | Morrison et al. |
| 2009/0230117 | A1 | 9/2009 | Fernando et al. |
| 2011/0155153 | A1 | 6/2011 | Thorens et al. |
| 2012/0048266 | A1 | 3/2012 | Alelov |
| 2012/0230659 | A1 | 9/2012 | Goodman et al. |
| 2013/0104916 | A1 | 5/2013 | Bellinger et al. |
| 2013/0192615 | A1 | 8/2013 | Tucker et al. |
| 2013/0199528 | A1 | 8/2013 | Goodman et al. |
| 2013/0319435 | A1 | 12/2013 | Flick et al. |
| 2014/0007891 | A1 | 1/2014 | Liu |
| 2014/0014126 | A1 | 1/2014 | Peleg et al. |
| 2014/0041658 | A1 | 2/2014 | Goodman et al. |
| 2014/0096781 | A1 | 4/2014 | Sears et al. |
| 2014/0096782 | A1 | 4/2014 | Ampolini et al. |
| 2014/0216484 | A1 | 8/2014 | Liu |
| 2014/0261408 | A1 | 9/2014 | DePiano et al. |
| 2014/0261486 | A1 | 9/2014 | Potter et al. |
| 2014/0270727 | A1 | 9/2014 | Ampolini et al. |
| 2014/0299137 | A1 | 10/2014 | Kieckbusch et al. |
| 2014/0334804 | A1 | 11/2014 | Choi |
| 2014/0338685 | A1 | 11/2014 | Amir et al. |
| 2014/0345633 | A1 | 11/2014 | Talon et al. |
| 2015/0034104 | A1 | 2/2015 | Zhou |
| 2015/0053214 | A1 | 2/2015 | Alarcon et al. |
| 2015/0128967 | A1 | 5/2015 | Robinson et al. |
| 2015/0136158 | A1 | 5/2015 | Stevens et al. |
| 2015/0164147 | A1 | 6/2015 | Verleur et al. |
| 2015/0196060 | A1 | 7/2015 | Wensley et al. |
| 2015/0208729 | A1 | 7/2015 | Monsees et al. |
| 2015/0216232 | A1 | 8/2015 | Bless et al. |
| 2015/0216236 | A1 | 8/2015 | Bless et al. |
| 2015/0216237 | A1 | 8/2015 | Wensley et al. |
| 2015/0224268 | A1 | 8/2015 | Henry et al. |
| 2015/0237916 | A1 | 8/2015 | Farine et al. |
| 2015/0258289 | A1 | 9/2015 | Henry, Jr. et al. |
| 2015/0305409 | A1 | 10/2015 | Verleur et al. |
| 2015/0320116 | A1 | 11/2015 | Bleloch et al. |
| 2015/0357608 | A1 | 12/2015 | Huang |
| 2015/0357839 | A1 | 12/2015 | Cai et al. |
| 2015/0359263 | A1 | 12/2015 | Bellinger |
| 2015/0359264 | A1 | 12/2015 | Fernando et al. |
| 2015/0374040 | A1 | 12/2015 | Chen |
| 2016/0021933 | A1 | 1/2016 | Thorens et al. |
| 2016/0057811 | A1 | 2/2016 | Tucker et al. |
| 2016/0174611 | A1 | 6/2016 | Monsees et al. |
| 2016/0242466 | A1 | 8/2016 | Lord et al. |
| 2016/0249684 | A1 | 9/2016 | Liu et al. |
| 2016/0255878 | A1 | 9/2016 | Huang et al. |
| 2016/0262459 | A1 | 9/2016 | Monsees et al. |
| 2016/0309786 | A1 | 10/2016 | Holtz et al. |
| 2016/0338407 | A1 | 11/2016 | Kerdemelidis |
| 2016/0360786 | A1 | 12/2016 | Bellinger et al. |
| 2016/0366939 | A1 | 12/2016 | Alarcon et al. |
| 2016/0374397 | A1 | 12/2016 | Jordan et al. |
| 2017/0006917 | A1 | 1/2017 | Alvarez |
| 2017/0019951 | A1 | 1/2017 | Louveau et al. |
| 2017/0042242 | A1 | 2/2017 | Hon et al. |
| 2017/0049151 | A1 | 2/2017 | Xue et al. |
| 2017/0079327 | A1 | 3/2017 | Wu et al. |
| 2017/0119052 | A1 | 5/2017 | Williams et al. |
| 2017/0135406 | A1 | 5/2017 | Reevell |
| 2017/0196263 | A1 | 7/2017 | Sur et al. |
| 2017/0251725 | A1 | 9/2017 | Buchberger et al. |
| 2017/0259170 | A1 | 9/2017 | Bowen et al. |
| 2017/0280779 | A1 | 10/2017 | Qui et al. |
| 2017/0290371 | A1 | 10/2017 | Davis et al. |
| 2017/0294804 | A1 | 10/2017 | Sur et al. |
| 2017/0302089 | A1 | 10/2017 | Bernauer et al. |
| 2017/0327949 | A1 | 11/2017 | Hidaka et al. |
| 2017/0367407 | A1 | 12/2017 | Althorpe et al. |
| 2018/0027978 | A1* | 2/2018 | Johnson ................. A47C 17/86 |
| 2018/0035714 | A1 | 2/2018 | Sur et al. |
| 2018/0042306 | A1 | 2/2018 | Atkins et al. |
| 2018/0070635 | A1 | 3/2018 | Litten |
| 2018/0070644 | A1 | 3/2018 | Monsees et al. |
| 2018/0070648 | A1 | 3/2018 | Monsees et al. |
| 2018/0084608 | A1 | 3/2018 | Bernauer et al. |
| 2018/0090945 | A1 | 3/2018 | Langlinais et al. |
| 2018/0140014 | A1 | 5/2018 | Yu et al. |
| 2018/0279685 | A1 | 10/2018 | Mayle et al. |
| 2018/0280637 | A1 | 10/2018 | Mayle et al. |
| 2019/0104767 | A1 | 4/2019 | Hatton et al. |
| 2019/0159523 | A1 | 5/2019 | Qiu |
| 2019/0261689 | A1 | 8/2019 | Bowen et al. |
| 2019/0313700 | A1* | 10/2019 | Lord ...................... F22B 1/284 |
| 2019/0373679 | A1* | 12/2019 | Fu ....................... H05B 3/0019 |
| 2019/0387795 | A1 | 12/2019 | Fisher et al. |
| 2020/0000146 | A1 | 1/2020 | Anderson et al. |
| 2020/0037668 | A1 | 2/2020 | Robert et al. |

(56) References Cited

U.S. PATENT DOCUMENTS

| | | | | |
|---|---|---|---|---|
| 2020/0046033 | A1 | 2/2020 | Robert et al. | |
| 2020/0120991 | A1 | 4/2020 | Hatton et al. | |
| 2023/0047657 | A1* | 2/2023 | Harrison | A24F 40/48 |
| 2024/0050671 | A1* | 2/2024 | Sur | A24F 40/51 |
| 2024/0245109 | A1* | 7/2024 | Harrison | A24F 40/48 |

FOREIGN PATENT DOCUMENTS

| | | | |
|---|---|---|---|
| CN | 101261163 | A | 9/2008 |
| CN | 101419098 | A | 4/2009 |
| CN | 101653354 | A | 2/2010 |
| CN | 101806640 | A | 8/2010 |
| CN | 202760174 | U | 3/2013 |
| CN | 203166461 | U | 8/2013 |
| CN | 103777670 | A | 5/2014 |
| CN | 103859604 | A | 6/2014 |
| CN | 103912429 | A | 7/2014 |
| CN | 203873004 | U | 10/2014 |
| CN | 104142463 | A | 11/2014 |
| CN | 105209873 | A | 12/2015 |
| CN | 204905326 | U | 12/2015 |
| CN | 205624466 | U | 10/2016 |
| CN | 106579560 | A | 4/2017 |
| CN | 105011375 | B | 12/2017 |
| CN | 108463127 | A | 8/2018 |
| CN | 108940704 | A | 12/2018 |
| CN | 208490842 | U | 2/2019 |
| CN | 109588779 | A | 4/2019 |
| DE | 202015009688 | U1 | 3/2019 |
| EP | 0358114 | A2 | 3/1990 |
| EP | 2399636 | A1 | 12/2011 |
| EP | 2895930 | A2 | 7/2015 |
| EP | 3092909 | A1 | 11/2016 |
| EP | 2797447 | B1 | 7/2017 |
| EP | 2797446 | B1 | 10/2017 |
| EP | 2645892 | B1 | 3/2019 |
| EP | 2959787 | B1 | 4/2021 |
| JP | 2013113551 | A | 6/2013 |
| JP | 2014530632 | A | 11/2014 |
| JP | 2018505696 | A | 3/2018 |
| KR | 101162688 | B1 | 7/2012 |
| KR | 101682319 | B1 | 12/2016 |
| KR | 10-2017-0137066 | A | 12/2017 |
| RU | 2609394 | C2 | 2/2017 |
| RU | 2643422 | C2 | 2/2018 |
| RU | 2646737 | C2 | 3/2018 |
| RU | 2654619 | C1 | 5/2018 |
| SG | 11201707778W | A | 10/2017 |
| TW | 200922096 | A | 5/2009 |
| TW | 201620405 | A | 6/2016 |
| WO | WO-2011137453 | A2 | 11/2011 |
| WO | WO-2012085207 | A1 | 6/2012 |
| WO | WO-2012120487 | A2 | 9/2012 |
| WO | WO-2013060781 | A1 | 5/2013 |
| WO | WO-2013120565 | A2 | 8/2013 |
| WO | WO-2014040988 | A1 | 3/2014 |
| WO | WO-2014102091 | A1 | 7/2014 |
| WO | WO-2014134781 | A1 | 9/2014 |
| WO | WO-2014166121 | A1 | 10/2014 |
| WO | WO-2015026081 | A1 | 2/2015 |
| WO | WO-2015100361 | A1 | 7/2015 |
| WO | WO-2015165747 | A1 | 11/2015 |
| WO | WO-2016101200 | A1 | 6/2016 |
| WO | WO-2016115689 | A1 | 7/2016 |
| WO | WO-2016172821 | A1 | 11/2016 |
| WO | WO-2016200382 | A1 | 12/2016 |
| WO | WO-2016202028 | A1 | 12/2016 |
| WO | WO-2017001817 | A1 | 1/2017 |
| WO | WO-2017020220 | A1 | 2/2017 |
| WO | WO-2017072705 | A2 | 5/2017 |
| WO | WO-2017084818 | A1 | 5/2017 |
| WO | WO-2017085242 | A1 | 5/2017 |
| WO | WO-2017156743 | A1 | 9/2017 |
| WO | WO-2018055761 | A1 | 3/2018 |
| WO | WO-2018107494 | A1 | 6/2018 |
| WO | WO-2018122411 | A1 | 7/2018 |
| WO | WO-2018153171 | A1 | 8/2018 |
| WO | WO-2018202403 | A1 | 11/2018 |
| WO | WO-2020006305 | A1 | 1/2020 |
| WO | WO-2020084756 | A1 | 4/2020 |

OTHER PUBLICATIONS

Dittmer, Greg (2008) Synchronous Boost Converters Provide High Voltage without the Heat, Linear technology magazine, 19-37 pages.

Low Level Measurements Handbook—7th Edition Precision DC Current, Voltage, and Resistance Measurements.

(Jun. 15, 2021) Resistance thermometer, https://en.wikipedia.org/wiki/Resistance_thermometer.

(Jun. 15, 2021) Room temperature, https://en.wikipedia.org/wiki/Room_temperature.

Tony R. Kuphaldt (2006) "Temperature coefficient of resistance", Lessons in Electric Circuits, vol. 1 DC, section 12.6.

(Sep. 2011) Linear Technology Data Sheet and Product Info for LTC3786 Low IQ Synchronous Boost Controller, Revision A, Available online at: https://cdn.ozdisan.com/ETicaret_Dosya/482058_5551574.pdf, 34 pages.

(Nov. 12, 2016) BYJU's, Ohm's Law, https://byjus.com/physics/ohms-law/, 19 pages.

* cited by examiner

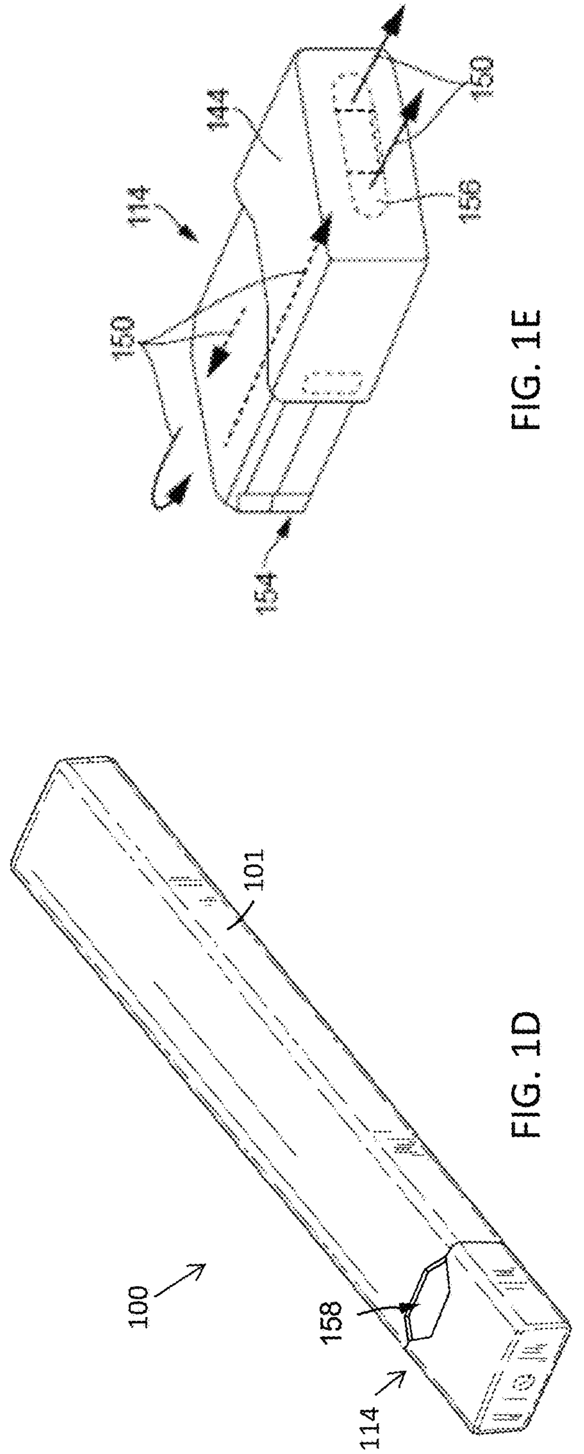
FIG. 1E
FIG. 1D
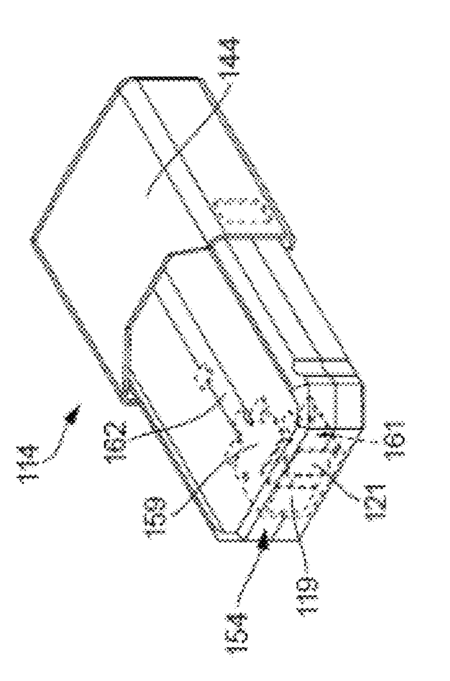
FIG. 1F

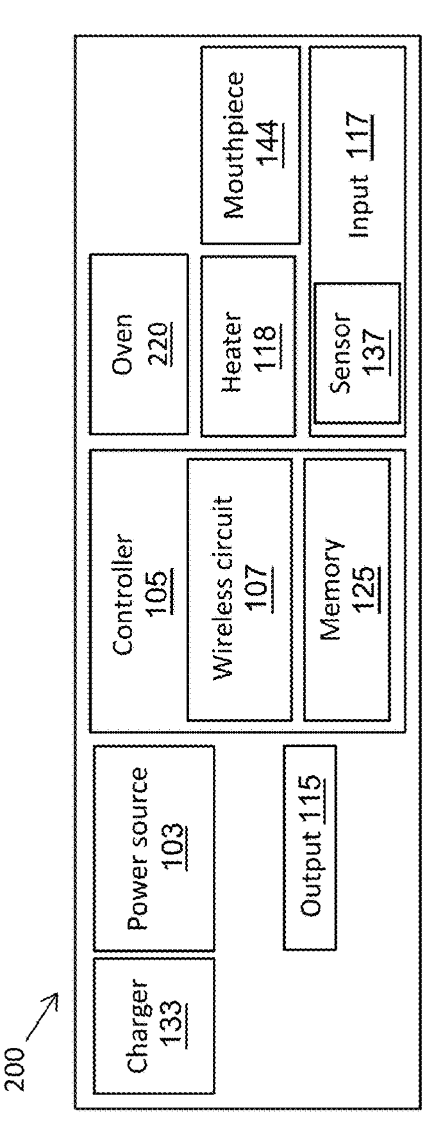
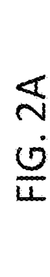
FIG. 2A
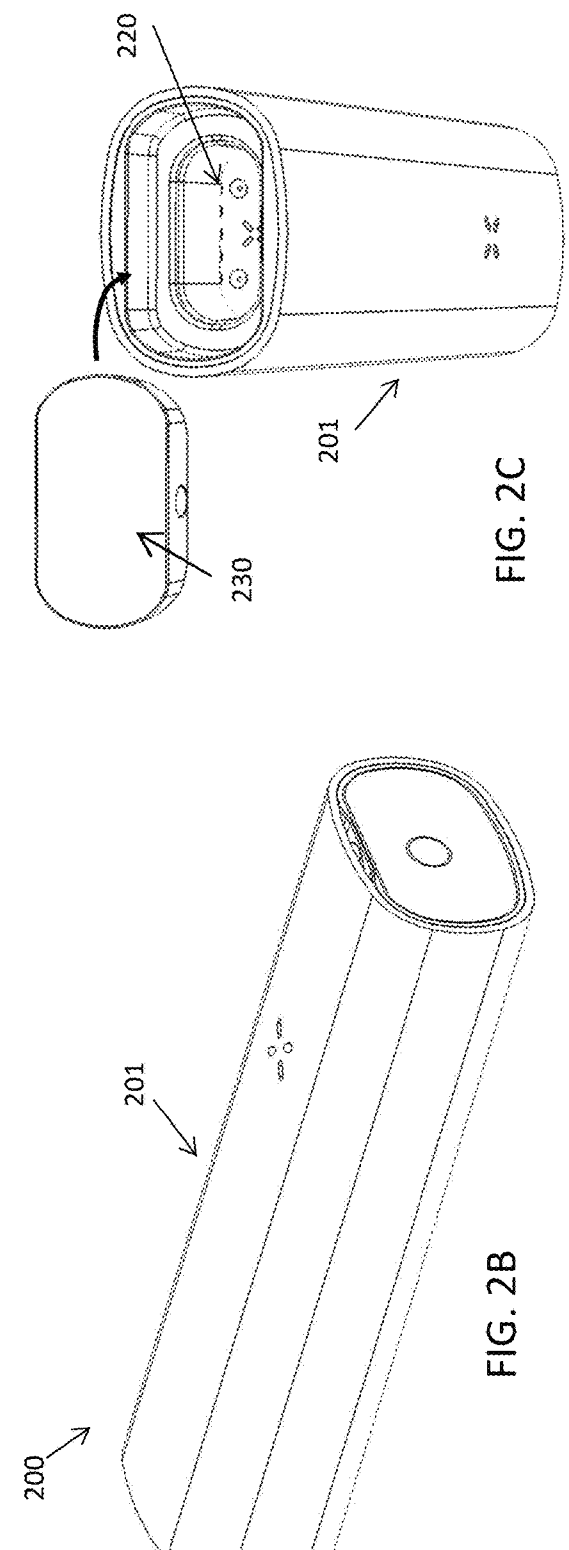
FIG. 2B
FIG. 2C

VAPORIZER DEVICE HEATER CONTROL

CROSS REFERENCE TO RELATED APPLICATIONS

This application is a continuation of U.S. patent application Ser. No. 17/240,895 filed Apr. 26, 2021 and entitled "VAPORIZER DEVICE HEATER CONTROL," which is a continuation of U.S. patent application Ser. No. 16/449,278 filed Jun. 21, 2019 and entitled "VAPORIZER DEVICE HEATER CONTROL," which claims priority under 35 U.S.C. § 119 to U.S. Provisional Patent Application No. 62/689,774 filed Jun. 25, 2018 and entitled "VAPORIZER DEVICE HEATER CONTROL," the entire contents of which are hereby expressly incorporated by reference herein.

TECHNICAL FIELD

The subject matter described herein relates to vaporizer devices, such as for example portable personal vaporizer devices for generating an inhalable aerosol from one or more vaporizable materials.

BACKGROUND

Vaporizer devices, which can also be referred to as electronic vaporizer devices or e-vaporizer devices, can be used for delivery of an aerosol (also sometimes referred to as "vapor") containing one or more active ingredients by inhalation of the aerosol by a user of the vaporizing device. Electronic nicotine delivery systems (ENDS) are a class of vaporizer devices that are typically battery powered and that may be used to simulate the experience of cigarette smoking, but without burning of tobacco or other substances. In use of a vaporizer device, the user inhales an aerosol, commonly called vapor, which may be generated by a heating element that vaporizes (which generally refers to causing a liquid or solid to at least partially transition to the gas phase) a vaporizable material, which may be liquid, a solution, a solid, a wax, or any other form as may be compatible with use of a specific vaporizer device.

To receive the inhalable aerosol generated by a vaporizer device, a user may, in certain examples, activate the vaporizer device by taking a puff, by pressing a button, or by some other approach. A puff, as the term is generally used (and also used herein) refers to inhalation by the user in a manner that causes a volume of air to be drawn into the vaporizer device such that the inhalable aerosol is generated by combination of vaporized vaporizable material with the air. A typical approach by which a vaporizer device generates an inhalable aerosol from a vaporizable material involves heating the vaporizable material in a vaporization chamber (also sometimes referred to as a heater chamber) to cause the vaporizable material to be converted to the gas (vapor) phase. A vaporization chamber generally refers to an area or volume in the vaporizer device within which a heat source (e.g. conductive, convective, and/or radiative) causes heating of a vaporizable material to produce a mixture of air, and the vaporizable material in some equilibrium between the gas and condensed (e.g. liquid and/or solid) phases.

Certain components of the gas-phase vaporizable material may condense after being vaporized due to cooling and/or changes in pressure to thereby form an aerosol that includes particles of a condensed phase (e.g., liquid and/or solid) suspended in at least some of the air drawn into the vaporizer device via the puff. If the vaporizable material includes a semi-volatile compound (e.g. a compound such as nicotine, which has a relatively low vapor pressure under inhalation temperatures and pressures), the inhalable aerosol may include that semi-volatile compound in some local equilibrium between the gas and condensed phases.

SUMMARY

In an aspect, a system includes a current source circuit; a system power input; and load switching circuitry coupling the current source circuit and the system power input to an output configured to couple to a vaporizer heating element. The current source circuit, the system power input, and the load switching circuitry form part of an integrated circuit.

One or more of the following features can be included in any feasible combination. For example, the system can includes protection circuitry configured to compare an operational parameter of a vaporizer device to a predetermined condition and, in response to determining that the operational parameter satisfies the condition, output an alarm signal. The protection circuitry can form part of the integrated circuit. The operational parameter can include voltage, current, temperature, current limit, and electrical short. The predetermined condition can include a predetermined threshold, the system further including at least one register storing the predetermined threshold. The protection circuitry can include a comparator circuit configured to compare the operational parameter of the vaporizer device and the predetermined threshold, the comparator circuit configured to output a signal indicative of the comparison. The protection circuitry can be configured to detect for heater timeout, temperature of subsystems within the vaporizer device, over voltage (OVP) protection, over current protection (OCP), under-voltage-lockout (UVLO), electrical shorts, current exceeding a limit, multi-level throttling, brown-out, and/or a heater-stop inhibit signal. The protection circuitry can include a watchdog timer circuit, and/or a redundant clock source.

The system can include control logic coupled to the protection circuitry and configured to receive the alarm signal and, in response to receiving the alarm signal, cause modification of operation of the vaporizer device including disconnecting at least one circuit within the vaporizer device from a power supply, modifying a clock speed of the at least one circuit, and/or modifying a power rail voltage of the at least one circuit.

The system can include a current monitor coupled to the first output and configured to couple to the vaporizer heating element, the current monitor configured to sense a current at the first output; a voltage monitor coupled to a second output configured to couple to the vaporizer heating element, the voltage monitor configured to sense a voltage across the vaporizer heating element; and control logic coupled to the current monitor and the voltage monitor, the control logic configured to receive data characterizing the sensed current at the first output, the sensed voltage across the vaporizer heating element and adjust operation of the load switching circuitry to adjust a temperature of the vaporizer heating element, the adjusting based on the received data.

The system can include an integrated boost converter configured to provide higher voltage to the load switching circuitry. The system can include power management unit circuitry including at least one low dropout regulator, a direct current rectifier, and a switching step-down down-converter; an analog to digital converter; a light emitting diode driver; and input-output circuitry.

The system can include a vaporizer device body including a vaporization chamber and a mouthpiece; a power source coupled to the power management unit circuitry; a controller coupled to the power management unit circuitry; an antenna; memory; an ambient pressure sensor; and an accelerometer.

The system can include circuitry configured to vary a duty cycle of a signal at the output based on a draw profile and/or a vapor profile, the draw profile characterizing duty cycle and draw strength, the vapor profile characterizing duty cycle and vapor production. The system can include a multiplexer including at least one switch, the multiplexer configured to switch an input between the load switching circuitry and a voltage monitor. The system can include a multiplexer including a first input connected to the load switching circuitry, a second input connected to a voltage monitor, a third input connected to the voltage monitor, a fourth input connected to a reference node, and four outputs, at least one of the four outputs connected to the output.

Systems and methods consistent with this approach are described as well as articles that comprise a tangibly embodied machine-readable medium operable to cause one or more machines (e.g., computers, microcontrollers, or the like, which may include general and/or special purpose processors or circuitry, etc.) to result in operations described herein. Similarly, computer systems are also described that may include a processor and a memory coupled to the processor. The memory may include one or more programs that cause the processor to perform one or more of the operations described herein.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 1D shows a diagram providing a top isometric perspective view of a vaporizer device with a cartridge inserted into a cartridge receptacle on a vaporizer device body consistent with some implementations of the current subject matter;

FIG. 1E shows a diagram providing a top isometric perspective view from a mouthpiece end of a cartridge suitable for use with a vaporizer device body consistent with some implementations of the current subject matter;

FIG. 1F shows a diagram providing a top isometric perspective view from an opposite end of a cartridge suitable for use with a vaporizer device body consistent with some implementations of the current subject matter;

FIG. 2A shows a schematic diagram illustrating features of a non-cartridge-based vaporizer device consistent with some implementations of the current subject matter;

FIG. 2B shows a diagram providing a side isometric perspective view of an example non-cartridge-based vaporizer device;

FIG. 2C shows a diagram providing a bottom isometric perspective view of the example non-cartridge-based vaporizer device;

DETAILED DESCRIPTION

Figures 1A, 1B, 1C:
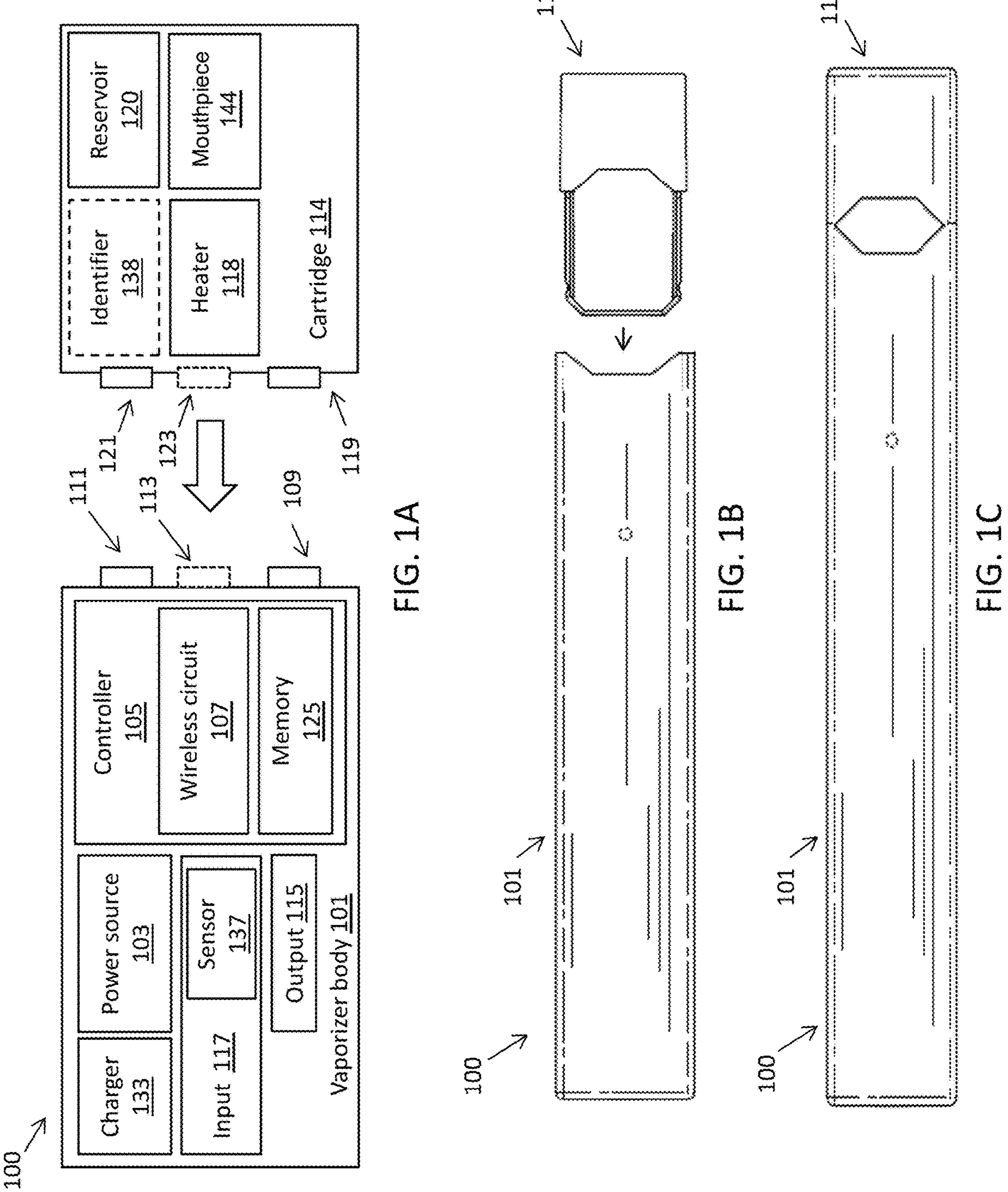
FIG. 1A shows a schematic diagram illustrating features of a vaporizer device having a cartridge and a vaporizer device body consistent with some implementations of the current subject matter.
FIG. 1B shows a diagram providing a top view of a vaporizer device with a cartridge separated from a cartridge receptacle on a vaporizer device body consistent with some implementations of the current subject matter.
FIG. 1C shows a diagram providing a top view of a vaporizer device with a cartridge inserted into a cartridge receptacle on a vaporizer device body consistent with some implementations of the current subject matter.

Some aspects of the current subject matter relates to integrated power management and heater control circuitry for vaporizer devices. The current subject matter can provide circuitry that enables improved vaporizer operation including improved heater performance and failsafe features thereby improving the vaporizer device. Some implementations of the current subject matter can include an integrated power management unit including heater control circuitry implemented as an integrated circuit (e.g., on a chip such as an application specific integrated circuit (ASIC)). By implementing some aspects of the current subject matter as an application specific integrated circuit, some aspects of the current subject matter can improve power supply management, reduce power requirements, provide flexible heater control, lower the number of discrete components thereby reducing variation in performance, and the like. Other advantages are possible.

Examples of vaporizer devices consistent with implementations of the current subject matter include electronic vaporizers, ENDS, and the like. As noted above, such vaporizers are typically hand-held devices that heat (by convection, conduction, radiation, or some combination thereof) a vaporizable material to provide an inhalable dose of the material. The vaporizable material used with a vaporizer may, in some examples, be provided within a cartridge (which may refer to a part of the vaporizer that contains the vaporizable material in a reservoir or other container and that can be refillable when empty or disposable in favor of a new cartridge containing additional vaporizable material of a same or different type). In some implementations, a vaporizer device may be any of a cartridge-based vaporizer device, a cartridge-less vaporizer device, or a multi-use vaporizer device capable of use with or without a cartridge. For example, a multi-use vaporizer device may include a heating chamber (e.g. an oven) configured to receive a vaporizable material directly in the heating chamber and also to receive a cartridge having a reservoir or the like for holding the vaporizable material. In various implementations, a vaporizer may be configured for use with liquid vaporizable material (e.g., a carrier solution in which an active and/or inactive ingredient(s) are suspended or held in solution or a liquid form of the vaporizable material itself) or a solid vaporizable material. A solid vaporizable material may include a plant-based or non-plant-based material that emits some part of the solid vaporizable material as the vaporizable material (e.g. such that some part of the material remains as waste after the vaporizable material is emitted for inhalation by a user) or optionally can be a solid form of the vaporizable material itself such that all of the solid material can eventually be vaporized for inhalation. A liquid vaporizable material can likewise be capable of being completely vaporized or can include some part of the liquid material that remains after all of the material suitable for inhalation has been consumed.

The term vaporizer device, as used herein consistent with the current subject matter, generally refers to portable, self-contained, devices that are convenient for personal use. Typically, such devices are controlled by one or more switches, buttons, touch sensitive devices, or other user input functionality or the like (which can be referred to generally as controls) on the vaporizer, although a number of devices that may wirelessly communicate with an external controller (e.g., a smartphone, a smart watch, other wearable electronic devices, etc.) have recently become available. Control, in this context, refers generally to an ability to influence one or more of a variety of operating parameters, which may include without limitation any of causing the heater to be turned on and/or off, adjusting a minimum and/or maximum temperature to which the heater is heated during operation, various games or other interactive features that a user might access on a device, and/or other operations.

Figure 3:
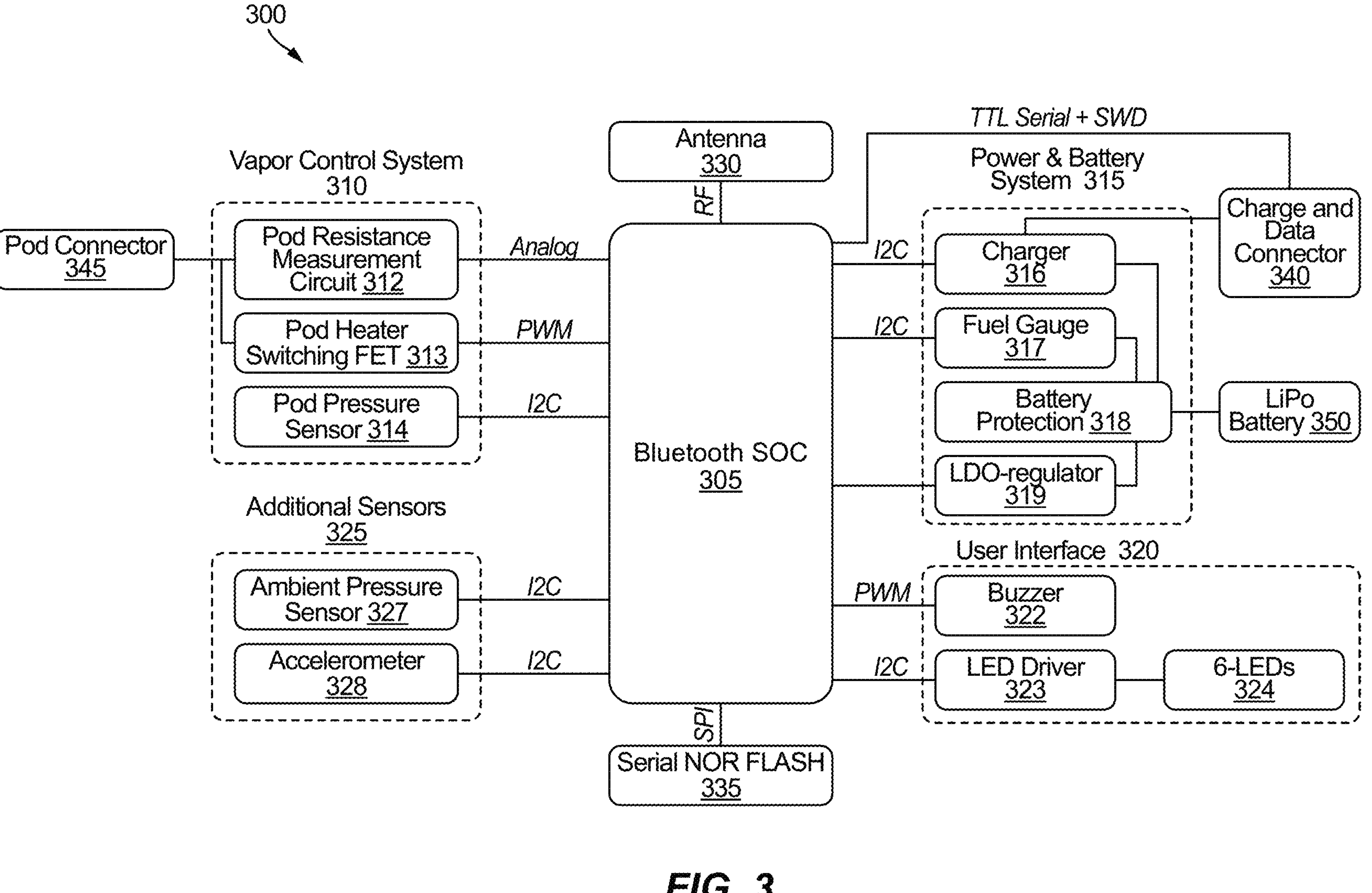
FIG. 3 is a system block diagram of an example vaporizer device that can include integrated power and/or heater control according to some aspects of the current subject matter.

FIG. 3 is a system block diagram of an example vaporizer device 300 that can include integrated power and/or heater control according to some aspects of the current subject matter. The example vaporizer device 300 includes a controller 305 with wireless (e.g., Bluetooth) support system on a chip (SOC) coupled to a vapor control system 310, power and battery system 315, user interface 320, additional sensors 325, antenna 330, memory 335, and connector 340. The example vaporizer device 300 further includes a power source 350 (such as a lithium battery) and a pod connector 345 for connecting with a pod that can include a heating element (e.g., electrically modeled as a resistor) and which contains vaporizable material.

The vapor control system 310 can enable vaporizing functionality of the device and includes a pod resistance measurement circuit 312, a pod heater switching field effect transistor (FET) 313, and a pod pressure sensor 314. The pod resistance measurement circuit 312 and pod heater switching FET 313 can operate to measure a temperature of a heating element of the pod (e.g. by briefly and intermittently interrupting a flow of current to the heating element, measuring a resistance of the heating element during these brief interruptions, and using a thermal resistance coefficient to obtain temperature from the measured resistance). The pod pressure sensor 314 can monitor pressure to detect any of a start, an end, or a continuation of a puff.

The power and battery system 315 operates to provide other systems of the device with power from the power source 350. The power and batter system 315 can include a charger 316, fuel gauge 317, battery protection 318, and low-dropout (LDO) regulator 319. The charger 316 can include charging circuitry, which may be controlled by the controller 305, and in some implementations can include an inductive charger and/or a plug-in charger. For example, a universal serial bus (USB) connection may be used to charge the vaporizer device 300 and/or to allow communication over a wired connection between a computing device and the controller 305. The charger 316 may charge the power source 350. The fuel gauge 317 can monitor battery information such as voltage, current, estimated state of charge, estimated capacity, cycle count, battery authentication, and the like. Fuel gauge 317 can provide this information to the controller 305 for use, e.g., to indicate battery status via user interface 320. The battery protection 318 can include switches to switch cells (such as lithium cells, or other cells, discrete power storage units, and the like of the power source 350) in and out of the circuit to protect the device 300 against overcharge, over-discharge, overly-rapid discharge, and the like. The LDO regulator 319 can regulate the output voltage of the lithium battery 350 in order to provide power to the rest of the vaporizer device 300.

User interface 320 includes a buzzer 322 (also referred to as a speaker), light emitting diode (LED) driver 323, and LEDS 324. The buzzer 322 can provide sonic and/or tactile feedback (e.g., vibration) and the LED driver 323 and LEDS 324 can provide visual feedback to the user.

Additional sensors 325 include an ambient pressure sensor 327, and accelerometer 328. The accelerometer 328 can enable detection of a rapid movement (such as a shaking motion) of the vaporizer device 300, which may be interpreted by the controller 305 (e.g. through receipt of a signal from the accelerometer 328) as a user command to begin communication with a user device that is part of a vaporizer system and that can be used for controlling one or more operations and/or parameters of the vaporizer device 300. Additionally or alternatively, detection of a rapid movement (such as a shaking motion) of the vaporizer device 300 may be interpreted by the controller 305 as a user command to cycle through a plurality of temperature settings to which the vaporizable material held within a cartridge is to be heated by action of the vapor control system 310.

Figure 4:
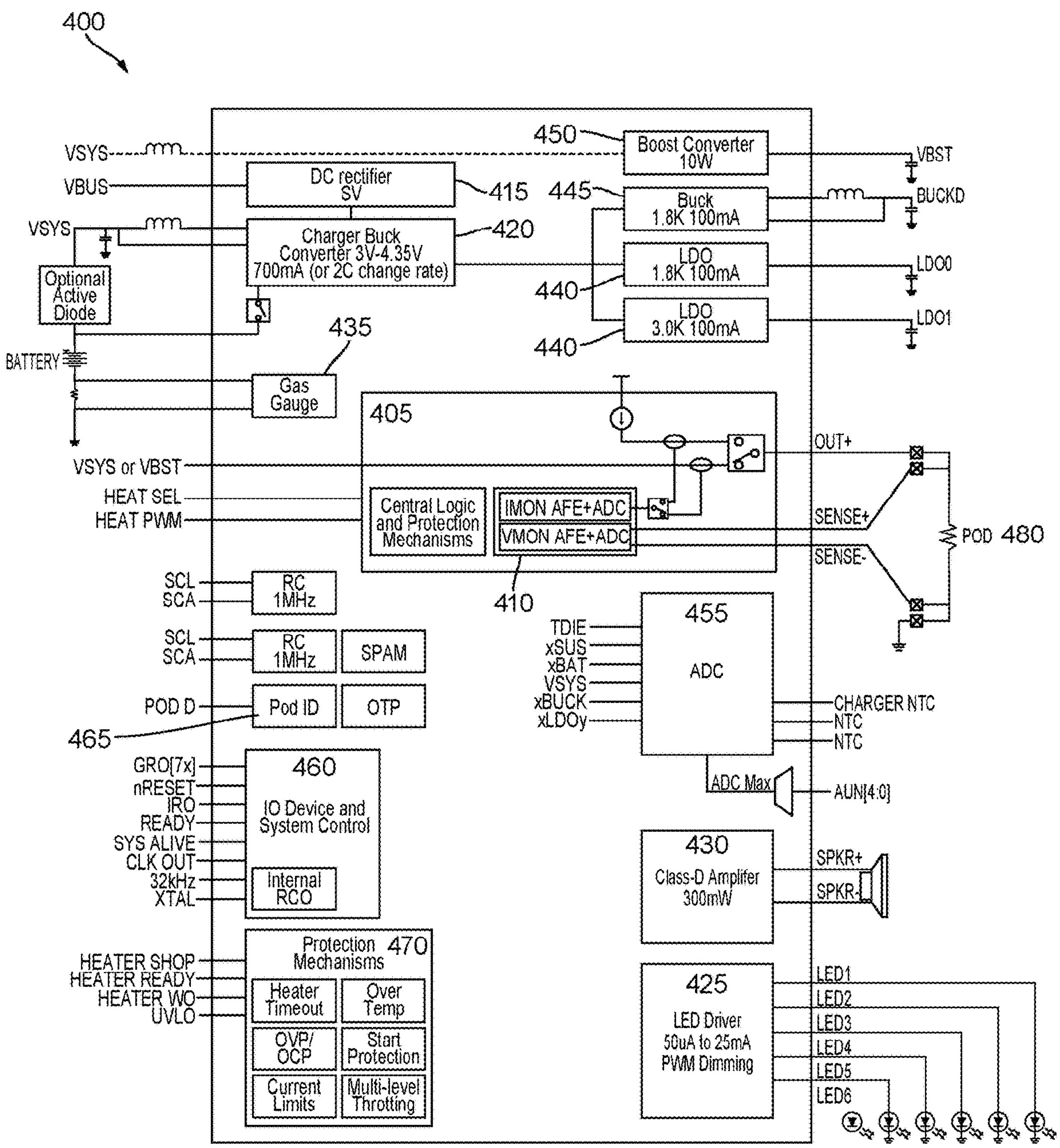
FIG. 4 is a system block diagram of an example integrated power management unit according to some aspects of the current subject matter.

FIG. 4 is a system block diagram of an example integrated power management unit 400 according to some aspects of the current subject matter, which can improve power supply management, reduce power requirements, provide flexible heater control, lower the number of discrete components thereby reducing variation in performance, and the like. The example integrated power management unit 400 can perform functionality of the vapor control system 310; power and battery system 315; and user interface 320. The example integrated power management unit 400 can interface with microcontroller 305 and integrates analog and power subsystems on a main board and high power flex.

The example integrated power management unit 400 includes heater control 405, measurement circuit 410, DC rectifier 415, charger 420, system power rails (not shown), LED driver 425, buzzer driver 430, and gas gauge 435 subsystems. In some implementations, the example integrated power management unit 400 does not integrate sensors (accelerometer, pressure sensors) and additional supporting components such as the pod connector 345, antenna 330, connector 340, and memory 335.

The integrated power management unit 400 can include LDO regulators 440, switching step-down down-converter 445 (e.g., buck), and boost converter 450. The integrated power management unit 400 can include analog to digital converter (ADC) 455 for monitoring of system voltages and currents as provided by the power management unit 400. The ADC 455 can monitor the die and remote NTC temperatures monitoring system temperatures in order to implement protection mechanisms, as described more fully below.

The integrated power management unit 400 can include input/output (TO) device and system control 460, which enables controller 305 to modify operation (e.g., configure) the integrated power management unit 400. The IO and system control 460 can include an internal oscillator as well as connections for an external oscillator for driving the system clock.

Figure 5:
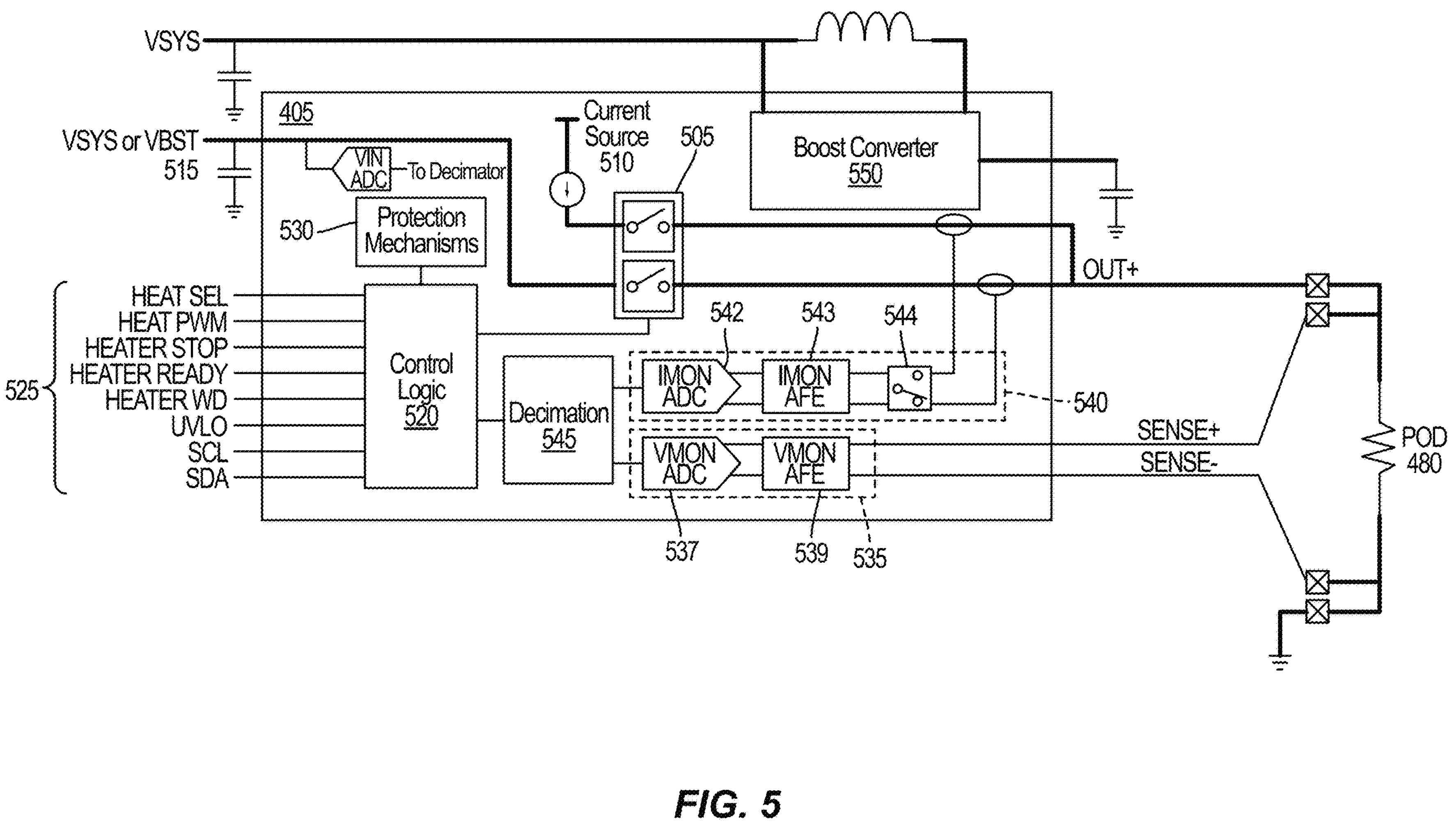
FIG. 5 is a system block diagram illustrating an example heater control according to some implementations of the current subject matter.

Heater control 405 can provide an integrated heat path and current source for heating of the pod heating element 480 (also referred to as the pod load), which is located within a pod. FIG. 5 is a system block diagram illustrating an example heater control 405 according to some implementations of the current subject matter. The heater control 405 can include a heat path that can include load switches 505 (e.g., switches as illustrated, a half-bridge topology, and the like) that controls the application of a current source 510 or external voltage 515 (denoted as VSYS/VBST) to the pod load 480 via drive line (denoted as out+). Load switches 505 can have non-overlap circuitry to guarantee timing (e.g., no risk of backpowering). Load switches can be controlled by controlled by control logic 520, which can be programmed and/or configured to adjust load switches 505 to heat the pod heater 480 to heat a vaporizable material contained in the pod. Control logic 520 can include one or more input terminals 525 or pins, which may receive signals from a device controller 305 or other system within the vaporizer device or integrated heater control 405. Similarly, current source 510 can be programmable and controlled by control logic 520. Load switches 505 can also be controlled by protection mechanism circuitry 530, described more fully below.

In some implementations, load switches 505 can be implemented as a half-bridge topology in which a DC battery voltage into a waveform ranging from 0 volts to battery voltage by varying the pulse width modulation frequency. This variable voltage/power waveform can be used to drive the pod heater 480. The half-bridge implementation can allow for higher inductance loads since the current free-wheels during off time.

Integrated heater control 405 can include integrated voltage monitor 535 and current monitor 540 coupled to the control logic 520 via a decimation block 545. Integrated voltage monitor 535 can include an ADC 537 and analog front-end 539 that can connect to the pod via sense+ and sense– connections to measure voltage across the pod heating element 480. The integrated current monitor 540 can include an ADC 542, analog front end 543, and switch 544 coupled to the drive line (out+) to measure current through the drive line (out+). Switch 544 may be configured to connect the integrated current monitor 540 to either the current source 510 or the external voltage 515, according to a mode of operation of the device. Voltage monitor 535 and current monitor 540 can provide their respective measurements, via decimation block 545, to the control logic 520 for processing and analysis. By utilizing integrated voltage monitor 535 and integrated current monitor 540, which can provide real time and synchronous voltage and current sensing, faster control loop response time and higher accuracy temperature control can be possible. Signal conditioning and filtering via analog front ends 538, 543 provides lower noise measurements.

In some implementations guaranteed performance can be possible (e.g. absolute accuracy, gain variance, group delay, and the like). In some implementations, a dedicated inter-integrated circuit (I2C) port can be included for uninterrupted data polling (e.g., 8 kHz) to controller 305.

In some implementations, integrated heater control 405 can include an integrated boost converter 550. The boost converter 550 can provide an optional source to the heater load switches 505 and can be disabled/bypassed. Inclusion of boost converter 550 can allow for flexible power delivery ranges for different pod resistances at high efficiency. In some implementations, the boost converter 550 can support programmable output voltage and current limits.

In some implementations, the integrated heater control 405 can include remote voltage sensing utilizing 4-wire sensing that compensates for losses caused by parasitic resistances and pod contact resistances. Such an approach can provide accurate and consistent measurements of the pod for higher accuracy temperature control. In some implementations, a multiplexer (mux) can be included to switch one line of the voltage monitor 535 between one or more of the four pod connections. For example, a mux can be implemented that can switch a first connection of the voltage monitor 535 between sense+ and out+.

Figure 6:
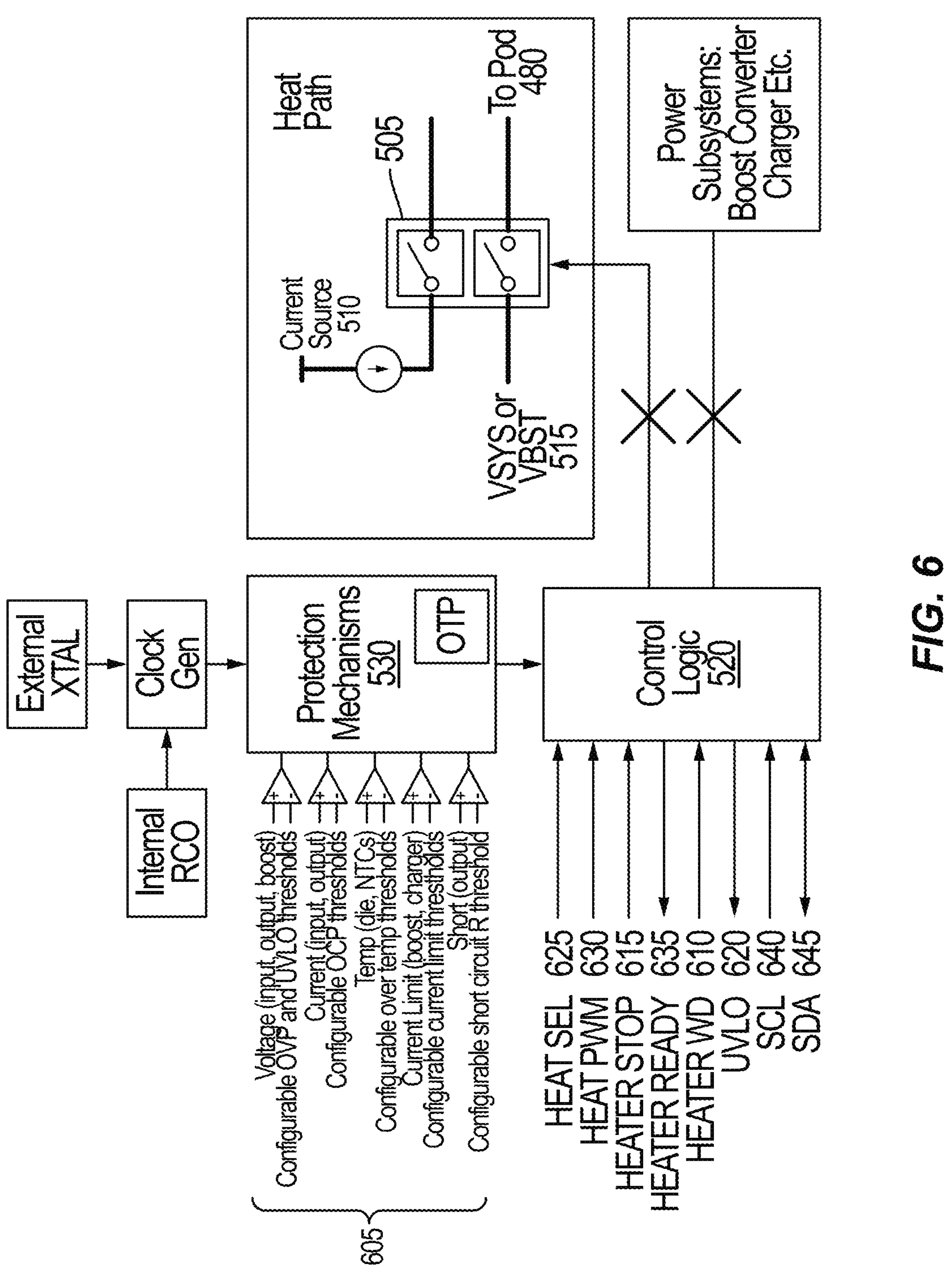
FIG. 6 is a system block diagram illustrating an example protection mechanism circuitry in more detail.

Integrated heater control 405 can include one or more protection mechanisms circuitry 530. FIG. 6 is a system block diagram illustrating an example protection mechanism circuitry 530 in more detail. The protection mechanisms can also be referred to as fail safe and safety mechanism circuitry. The protection mechanisms circuitry 530 can be operatively coupled with the system clock, the control logic 520, and can include configurable protection comparators 605 that compare predetermined thresholds (e.g., stored in registers), to operational parameters of the vaporizer device. These operational parameters can include voltage (e.g., pod input, pod output, boost), current (e.g., pod input, pod output), temperature (e.g., die, negative temperature coefficient resistors (NTCs)), current limit (e.g., boost, charger), and short (e.g., output). During operation of the vaporizer device, the operational parameters, which may be obtained via one or more sensors or sensing circuitry, can be compared to their respective thresholds to determine whether the operational parameter is above or below the threshold. If an operational parameter is determined to be abnormal (e.g., above a high-threshold or below a low-threshold), the protection mechanisms can signal an alarm to control logic 520. In response to receiving an alarm signal from the protection mechanism circuitry 530, the control logic 520 can modify operation of the device, for example, can cut-off certain subsystems from power (e.g., disconnect circuitry or features of the vaporizer device). For example, if the temperature of the pod is determined to be too high and the protection mechanism circuitry 530 generates an alarm, control logic 520 can disconnect the heat path (e.g., the current source 510, load switches 505) from providing current to the pod heater 480.

Another example protection mechanism (e.g., failsafe) can include a heater timeout. The protection mechanism circuitry 530 can include a hardware timer that can disable continuous heating of the pod heating element 480 (e.g., coil) to protect against firmware or sensor hangs. In some implementations, the timeout durations can be programmable (e.g., 5 s, 10 s, 20 s, 40 s, and the like).

Another example protection mechanism (e.g., failsafe) can include over temperature protection. The protection mechanism circuitry 530 can implement a thermal based protection scheme that utilizes various thermal sensors in the vaporizer device to throttle and/or disable various subsystems. These thermal sensors can include negative temperature coefficient resistors (NTCs) that allow for temperature monitoring at different system locations for feature throttling and protection, dedicated battery NTC for charging based throttling and protection, on die temperature monitoring to prevent silicon damage, and the like. In the event the protection mechanisms circuitry 530 determine that a temperature reading within the vaporizer device is too high, control logic 520 can alter operation of the vaporizer device to reduce heat generation. Reducing heat generation can be performed, for example, by changing clock speed; power voltage levels; powering down certain subsystems or portions of the device and/or circuitry; and the like.

Another example protection mechanism (e.g., failsafe) can include over voltage/current protection (OVP/OCP) and under-voltage-lockout (UVLO). The protection mechanism circuitry 530 can disable subsystem and functionality if voltage and currents are outside of expected operating range (e.g., as detected by protection comparators 605, which can include fast reacting comparator based triggers). In some implementations, OVP/OCP and UVLO can be implemented on heater path signals and high power subsystems.

Another example protection mechanism (e.g., failsafe) can include short protection. The protection mechanism circuitry 530 can disable outputs of different subsystems when electrical shorts are detected (e.g., current draw can increase and a short can be detected by a protection comparator 605). In some implementations, short protection can be implemented for output power rails for charger, DCDC converters, LED driver, speaker (e.g., buzzer) amplifier, and the like. In some implementations, short protection can be implemented for pod heater 480 output with programmable resistance thresholds.

Another example protection mechanism (e.g., failsafe) can include current limits. The protection mechanism circuitry 530 and protection comparators 605 can detect a maximum current threshold (e.g., cap) in order to prevent exceeding ratings of external devices/components. In some implementations, these current limit thresholds can be programmable.

Another example protection mechanism (e.g., failsafe) can include multi-level throttling and brownout protection. The protection mechanism circuitry 530 and protection comparators 605 can perform real time monitoring of system voltages and temperatures. The control logic 520 can, in response to protection mechanism circuitry 530 determining that an alarm is triggered, inhibit functionality of different subsystems of the vaporizer device depending on system conditions (e.g., disable heating in cold, disable charging in hot, and the like). In some implementations, these thresholds and behaviors can be programmable.

Another example protection mechanism (e.g., failsafe) can include a redundant clock source. The protection mechanism circuitry 530 can include an internal RCO and optional external 32 kHz XTAL. Such a redundant clock source can guarantee functionality of the real-time clock (RTC) that controls the heater timeout safety feature so that the RTC is not dependent on an external component, which may be more susceptible to failures.

Another example protection mechanism (e.g., failsafe) can include a hardware watchdog timer. The protection mechanism circuitry 530 can include an external clocking pin 610 required to keep heat path capability functional. Such a hardware watchdog timer can protects against firmware or hardware (e.g., sensor) latch ups (e.g., hands, freezes, and the like). In some implementations, the clock rate timing thresholds can be programmable.

Another example protection mechanism (e.g., failsafe) can include a heater stop inhibit pin 615. The protection mechanism circuitry 530 can include an open drain architecture that allows other subsystems (e.g., controller 305) to disable the heater (e.g. fault from a sensor). In some implementations, disabling the heater includes a programmable delay time.

Another example protection mechanism (e.g., failsafe) can include a UVLO pin 620. The protection mechanism circuitry 530 can include an additional UVLO output pin 620 to notify the system of low voltage, which can allow other external subsystems to independently handle low voltage conditions.

Another example protection mechanism (e.g., failsafe) can include fast and graceful shutdown behavior. The protection mechanism circuitry 530 can cause shutdown behavior caused by fault conditions or protection mechanisms handled gracefully in hardware without need of firmware control. For example, for OVP, OCP, short detection over temp, the heater and/or high power subsystems can be immediately shut down (e.g., within 10 μs to 100 μs) in a manner that does not rely on ADC sampling to determine fault conditions. In some implementations, each subsystem can have a respective shutdown mechanism and/or circuitry. For example, faults on the heater control 405 can disable the heater block and no other portions of the system.

In some implementations, one or more parameters, settings, or values can be configured to be one time programmable (OTP). Various described timeout and safety features can be hard programmed via manufacture or customer OTP. Desired settings that are OTP can be specified once and then cannot be reprogrammed or reconfigured afterwards. OTP can prevent misconfiguration or user error and core fail-safe related values not susceptible to undesired modification (e.g., after market modification).

In some implementations, integrated heater control 405 can include additional pins connected to control logic 520 for causing operation of the integrated heater control 405. For example, these pins can include a heat select pin 625, a heat pulse width modulation (PWM) pin 630, a heater ready pin 635, a clock line (SCL) pin 640, and a data line (SDA) pin 645. Heat select pin 625 can enable selection between current source and load switch to drive the pod. Heat PWM 630 can enable load switch to vary power delivered to the pod heater 480 for temperature control. Heat ready pin 635 can include an enable pin for the heater control 405. Heater stop pin can include an inhibit pin to disable the heater control 405. SCL pin 640 and SDA pin 645 can enable a dedicated I2C bus to poll heater voltage and current sense data.

In some implementations, and as noted above, the integrated heater control can 405 include registers for configuring operational parameters (including performance and safety parameters) such as overvoltage protection (OVP), overcurrent protection (OCP), current limits, hardware timeouts, and the like.

In some implementations, an integrated heater control 405 can provide many technical advantages. For example, an integrated heater control 405 can reduce the number of discrete external components required in a vaporizer device, which can reduce variation in device performance due to component tolerance and mismatch. Further, an integrated heater control 405 can include a fast startup from sleep (e.g., 5 ms) and fast measurement settling times (e.g., <100 μs).

Referring again to FIG. 4, in some implementations, the integrated power management unit 400 includes protection mechanisms 470. Protection mechanisms 470 can be implemented in the heater control 405, as described with respect to FIG. 5, or within the power management unit 400 as a logic block separate from the heater control 405. Protection mechanisms can act on all blocks independently and can respond similarly, e.g. shutdown on a short detection.

In some implementations, the integrated power management unit 400 can include pod ID 465. Pod ID 465 can store calibration data and pod information that can feed into a better user experience through more detailed and accurate usage information (which pods device has seen, nicotine consumption log, pod fill level estimates, and the like). In some implementations, an identifier of the POD is factory programmed and prevents counterfeiting. Communication can be wireless, signal over power, or signal wire interface.

Some implementations of the current subject matter can provide for electrical improvements to vaporizer devices. For example, some implementations of the current subject matter can include a linear charger for feature parity (e.g., can achieve feature parity for charging performance in terms of charge time and efficiency) or a switching charger for faster charge rates and lower hot spots. Some implementations can include integrated voltage and/or current monitoring on xBUS/xBAT/xSYS lines, which can be voltage and current measurements of a USB port, battery, and system; hardware adjustable current limit (ILIM), charge current, termination voltage, and the like; Japanese Electronics and Information Technology Industries Association (JEITA) compliant; can include remote NTCs temperature monitoring; and can include an integrated input DC rectifier.

In some implementations, the LED driver is suitable to drive 6 LEDs with increased performance when compared to a discrete driver. Some implementations of the LED driver can drive current in the 50 uA to 25 mA range, include 11 bit current step resolution with PWM dimming, without CP required. In some implementations, the LED driver can detect when the LED is short and/or open, when LED is over voltage and over current. In some implementations, blue tooth low energy (BLE) performance can meet or exceed known systems.

In some implementations, the speaker/buzzer driver can include a full H-bridge topology enabling the buzzer to run forwards and backwards. Sample rates can include 8 kHz or 16 kHz with 8 bit or 12 bit resolution. The speaker/buzzer driver can include pulse density modulation (PDM) input, short protection, and internal ram loaded with a waveform and supporting looping capability.

Some implementations of the current subject matter enables lower power consumption. For example, an integrated SoC/PMU can provide full power state control over all subsystems. Power states can be configurable by SoC or wake sources. A pod ID wake source can be utilized to keep device in lowest power state possible without pod such that device operates in ultra-low power (e.g., hibernation) mode when a pod is not connected. In some implementations, hibernation mode can draw 1.1 uA, sleep mode can draw 5 uA (various sleep/pod detect modes and without BLE), and BLE advertising mode can draw 1.7 mA, which can power a device for ~1 week in some implementations.

Some implementations of the current subject matter includes internal ADCs for all internal power rails that can enable thorough and extensive inline factory testing and can enable full system monitoring during usage. Self-testing can reduce the need for complex test fixture assemblies and test procedures. Reduced test time and increased units per hour (UPH). Some implementations can enable simplified surface mount assembly (SMA) with fewer ICs, discrete components, and passives.

Some implementations of the current subject matter can include a single package chip scale package (CSP) that can replace 16 or more discrete ICs; reduce the number of points of failure; lower number of external passives components; and can be implemented with a 0.35 mm (or other sized) pitch.

Referring again to FIG. 3, some implementations of the current subject matter can include a vaporizer device that utilizes a standalone heater control, such as or similar to the heater control 405 described with reference to FIGS. 4-6, in place of discrete vapor control system 310 without replacing power and battery system 315 or user interface 320 with integrated circuitry. Some implementations of the current subject matter can include a vaporizer device that utilizes an integrated power management unit, such as or similar to the integrated power management unit 400 described with reference to FIG. 3-6, in place of discrete power and battery system 315, user interface 320, and vapor control system 310. Other implementations and variations are possible.

Figure 7:
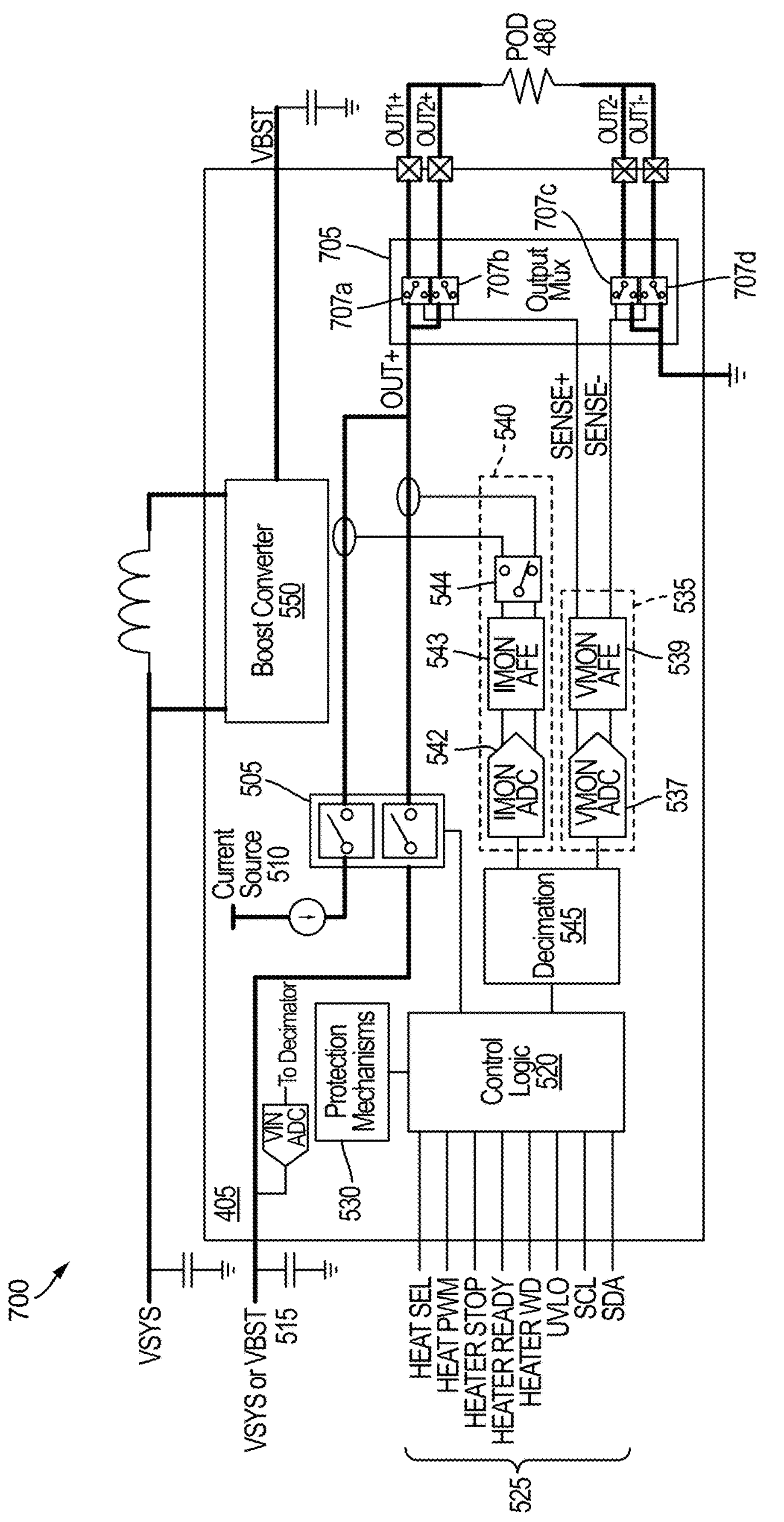
FIG. 7 is a system block diagram illustrating another example heater control according to some implementations of the current subject matter.

FIG. 7 is a system block diagram illustrating another example heater control 700 according to some implementations of the current subject matter. The illustrated example includes an integrated output mux 705 for switching the drive (out+) and sense (sense+, sense−), which can be performed to measure and compensate for poor pod contacts. The mux 705 can receive out+, sense+, sense−, and a fourth line (e.g., ground) and provide four outputs (out1+, out2+, out1−, and out2−). The mux 705 can allow for heating on both contacts or taking a remote 4 point voltage measurement on both combinations of contacts. For example, if the mux 705 is connecting the sense+ line to out2+ and it is determined that the contact associated with the out2+ line is faulty, the mux 705 can switch the sense+ (e.g., voltage monitor) to the out1+ line in order to continue operation. The example mux 705 illustrated in FIG. 7 includes four switches (707*a*, 707*b*, 707*c*, and 707*d*), two multiplexing out+ and sense+(707*a*, 707*b*); and two switches multiplexing sense- and ground (707*c*, 707*d*).

Figure 8:
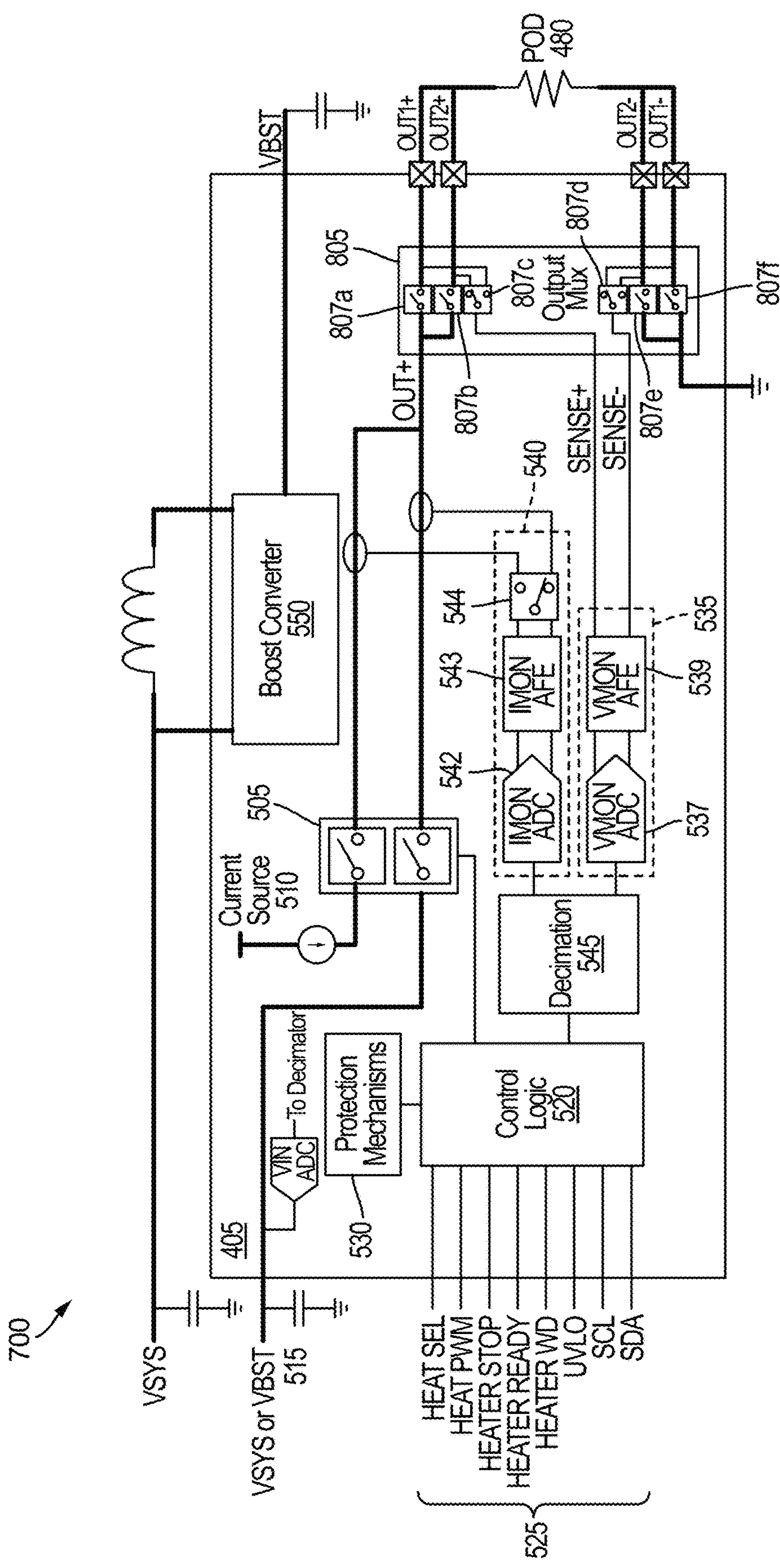
FIG. 8 is a system block diagram illustrating another example heater control according to some implementations of the current subject matter.

FIG. 8 is a system block diagram illustrating another example heater control according to some implementations of the current subject matter. The mux 805 in the illustrated example includes three switches multiplexing out+ and sense+ (807*a*, 807*b*, and 807*c*); and three switches multiplexing sense- and ground (807*d*, 807*e*, 807*f*). The example illustrated in FIG. 8 can be advantageous in that it can allow for taking voltage measurement on both combinations of contacts.

In some implementations, the integrated output muxing enables remote 4-wire voltage sensing to be performed on either pair of output lines for compensation of poor contact resistance to the pod and can enable local 2-wire voltage sensing for compensation of parasitic routing resistance.

Figure 9:
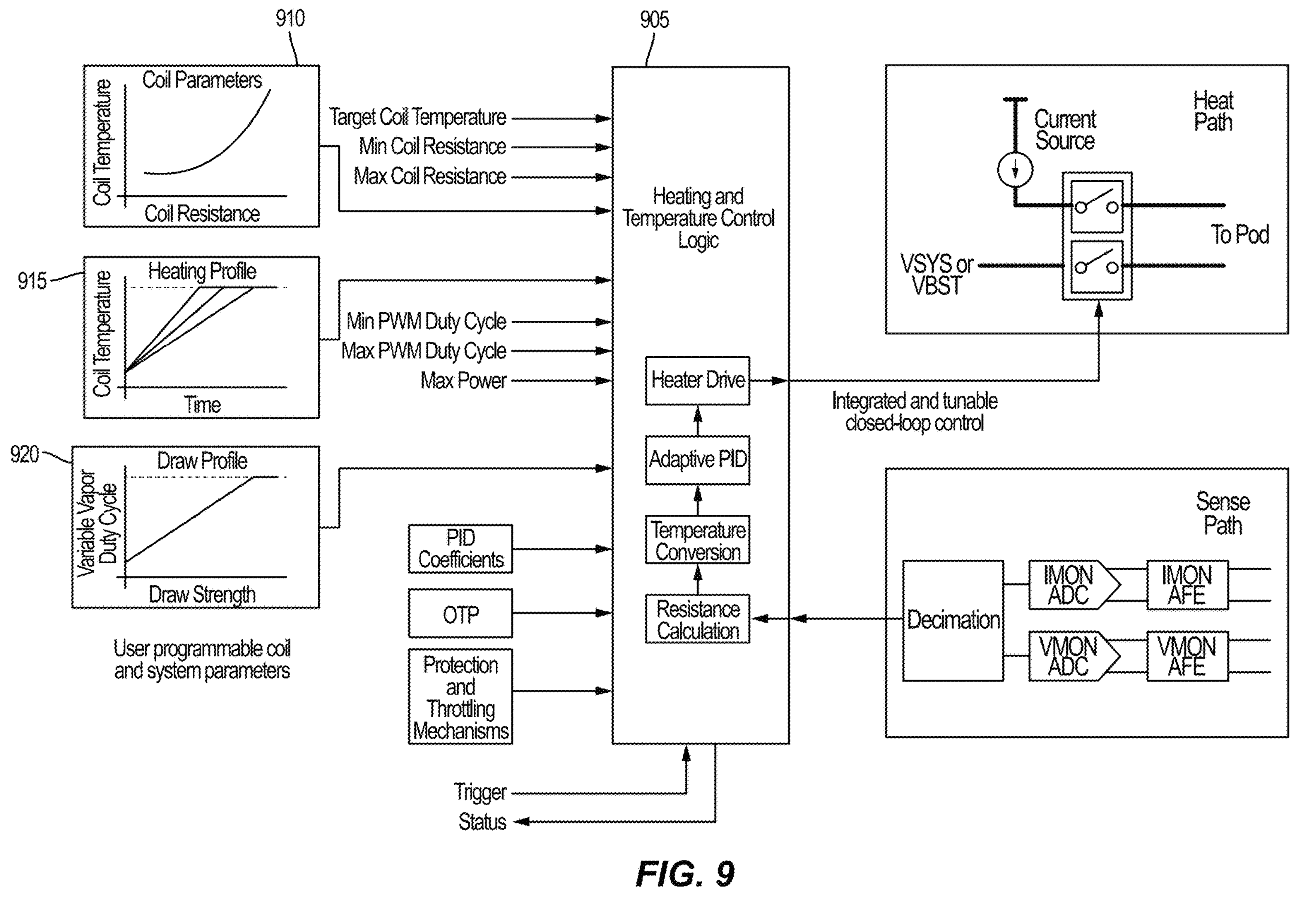
FIG. 9 is a system block diagram according to some implementations of the current subject matter.

FIG. 9 is a system block diagram according to some implementations of the current subject matter. In the example of FIG. 9, a heating and temperature control logic 905 can include and/or enable additional functionality including user programmable coil and system parameters such as use of coil parameters 910, heating profiles 915, and draw profiles 920. The example heater control can enable an integrated and tunable closed-loop control. The heating temperature and control logic 905 can receive the measurements taken by the voltage and current monitors, perform resistance calculation, temperature conversion, adaptive PID, and heater drive to control the load switches in the heat path.

The heating and temperature control logic 905 can utilize coil parameters 910, which relates coil resistance to temperature (thus the temperature of the coil (e.g., pod heating element 480) may not be directly measured, but determined from the measured voltage and current). Heating and temperature control logic 905 can utilize a heating profile 915, which can characterize coil temperature over time. The heating profile 915 can enable the heating and temperature control logic 905 to appropriately drive the pod heater 480 (e.g., coil) in order to achieve the target temperature. Heating and temperature control logic 905 can utilize a draw profile 920, which can characterize the amount of vapor (e.g., variable vapor duty cycle) to create based upon draw strength of a puff. The draw profile 920 can be used to implement dynamic and/or variable vapor production.

In some implementations, the heating and temperature control logic 905 can include user programmable coil parameters. These user programmable coil parameters can include target coil resistance (TCR), which can allow for accurate coil temperature estimation for a wide range of pods (which can be implemented in a lookup table, as a mathematical function, and the like); target regulation temperature for vaporization; and minimum and maximum expected coil resistance range for fault checking and for measurement range optimization.

In some implementations, the heating and temperature control logic 905 can include user programmable system parameters. These can include a heating profile 915 that allows for a more consistent vapor experience; a draw profile 920 that allows for a more customizable and realistic vapor experience; a minimum and maximum duty cycle to bound hardware behavior across different (e.g., all) operating conditions; maximum power which can provide a more consistent heating profile and can protect the system across different (e.g., all) operating conditions; and PID coefficients for tuning of closed-loop algorithm.

In some implementations, the heating and temperature control logic can include one time programmable settings and protection/throttling mechanisms that can guarantee safe operation independent of control loop behavior; output of closed-loop temperature control block can adjust the heater block to an appropriate drive level; input for the closed-loop temperature control block can be taken for coil/system parameters and the dedicated coil voltage and current sensing monitors; and can include flexible trigger sources such as an option to provide a fixed draw/vapor production level and/or an option to provide a level dependent trigger that can provide variable vapor production based on draw strength.

Figure 10:
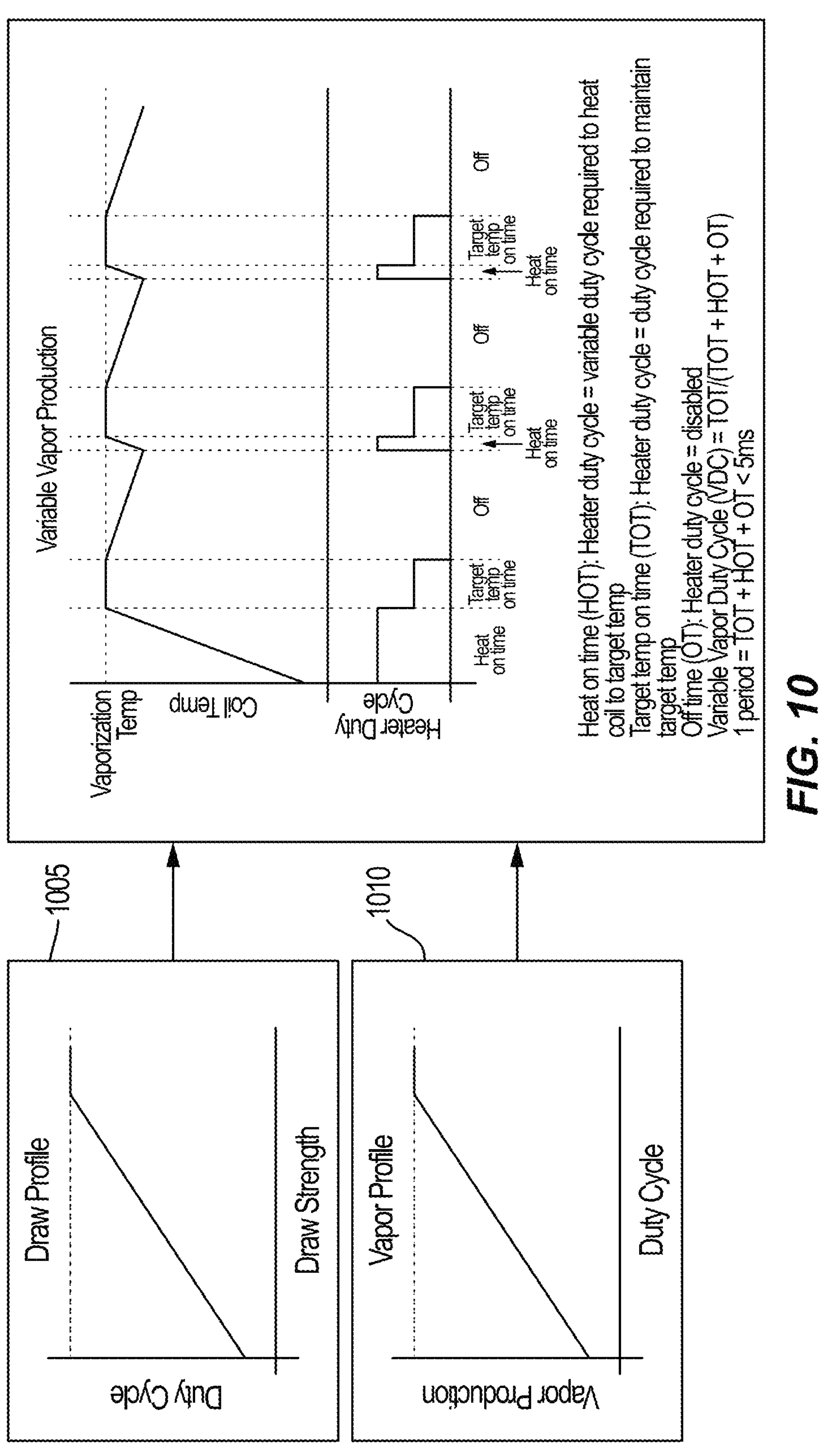
FIG. 10 illustrates an example of variable vapor production.

FIG. 10 illustrates an example of variable vapor production. A draw profile (which can relate draw strength and duty cycle) 1005 and vapor profile 1010 (which can relate vapor production and duty cycle) can be utilized to create variable vapor production. In variable vapor production, duty cycle of the heater can be varied to control coil temperature to achieve a target temperature on time. This can include heat times that will achieve the target temperature on time (e.g., the time in which the pod is at the vaporization temperature) and off time (e.g., the time in which the pod is below the vaporization temperature) such that multiple on and off periods can occur within a single puff. By having variable length on-off periods, the amount of vapor produced can be controlled. Utilizing this approach a user can specify certain vapor amounts (e.g., dial down or up) that will be created during a puff.

In some implementations, variable vapor production can provide the user with a more customizable and/or realistic vapor profile. Variable vapor can be produced by duty cycling the time at which the coil temperature is regulated to the vaporization temperature. The amount of vapor produced can be fixed via a user application or dynamically changed in real time based on draw strength. A draw profile (e.g., duty cycle for a given draw strength) and vapor profile (vapor production for a given duty cycle) can be used to create this variable vapor profile. The frequency of the variable vapor duty cycle can be high enough to cause no discernable gaps in vaporization and low enough so that the heat PWM has enough cycles to regulation to the vaporization temperature.

Figure 11:
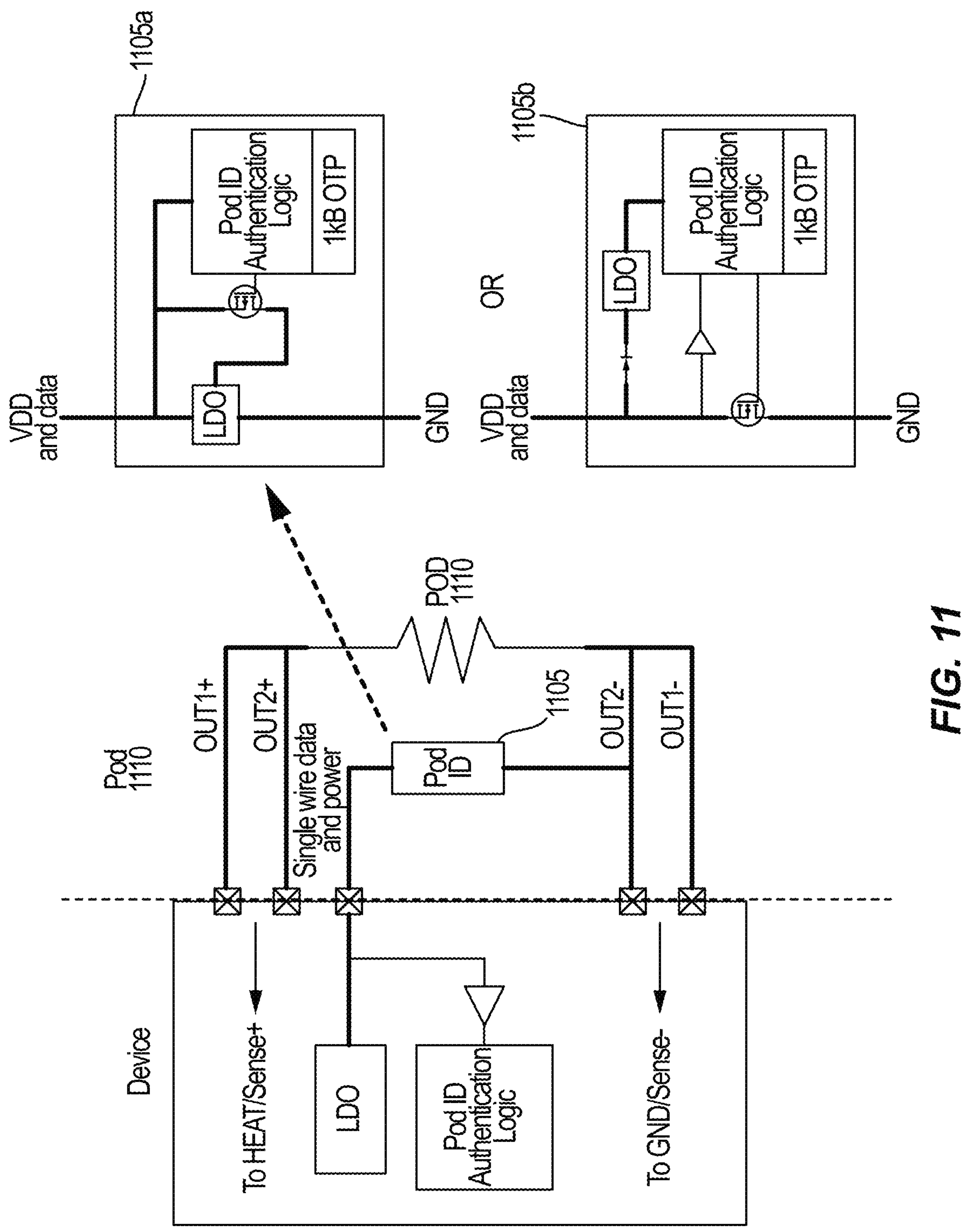
FIG. 11 is a block diagram illustrating pod identifier circuitry according to some implementations.

FIG. 11 is a block diagram illustrating pod identifier circuitry 1105 according to some implementations. The pod 1110 can contain a heating coil 1115 and pod identifier integrated circuit (PIC) 1105. Two example implementations of the PIC are illustrated at 1105*a* and 1105*b*.

The PIC 1105 can include a 2-pin device, one pin for ground and a second for both power and data. The PIC 1105 power and data over a single wire scheme can be flexible as long as the host IC on the device side uses the same protocol. In some implementations, the PIC 1105 can contain 1 kB OTP for sorting information, internal logic for reading/writing to OTP, and an internal power supply to properly supply the internal logic given the single wire power/data scheme. The PIC 1105 OTP storage of information can be user defined and flexible in structure. The PIC 1105 OTP can be designed to be programmed on the pod manufacturing line and cannot be modified/overwritten after programming. The PIC 1105 one time programming storage can be intended to store pod specific information such as serial number, flavor, coil resistance, and other various pod parameters. Such information can be utilized by the system to further enhance performance (e.g., heat consistency) and security via pod authentication.

Figure 12:
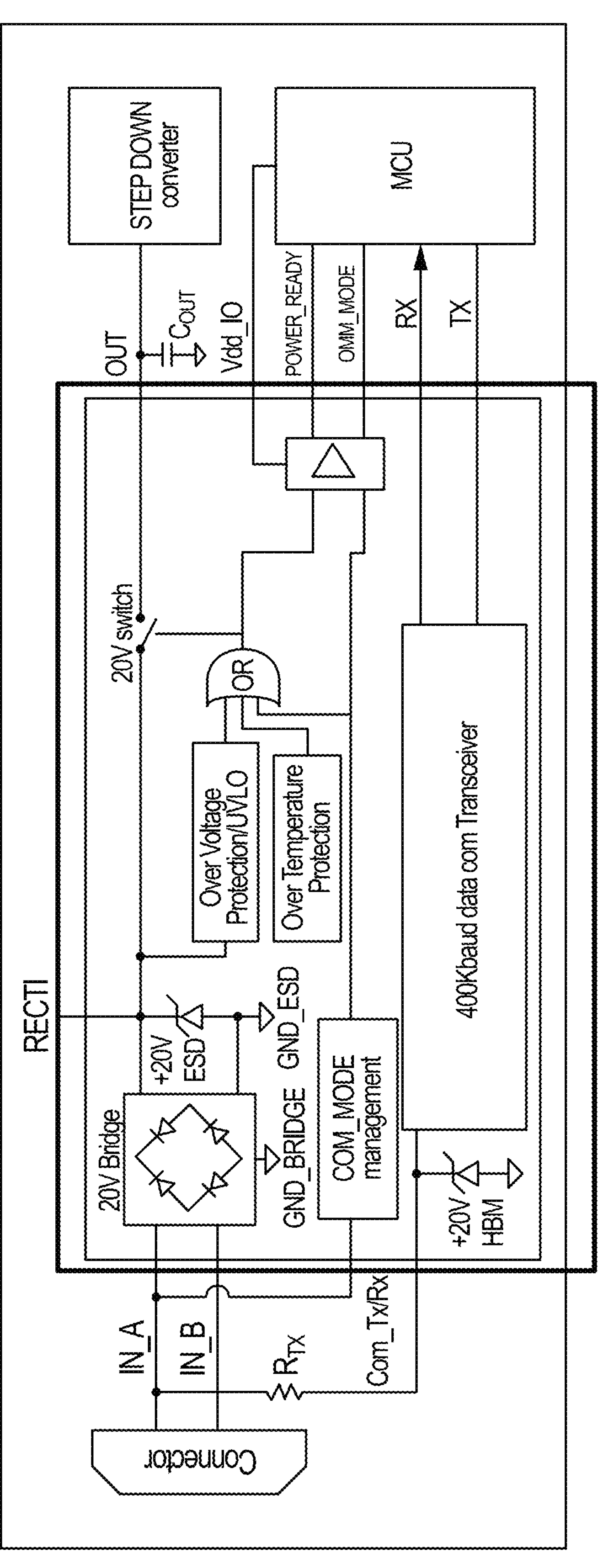
FIG. 12 is a block diagram illustrating an example power management unit according to some implementations. When practical, similar reference numbers denote similar structures, features, or elements.

FIG. 12 illustrates an example power management unit 1200 according to some implementations. The power management unit 1200 can include a rectifier bridge and dedicated over voltage protection (OVP) and over temperature protection (OTP) circuitry. In addition, the power management unit 1200 can include a communication mode management to enable communication over power functionality. The power management unit 1200 connects to an external connection, such as contacts configured to connect to a USB connection, and enables both charging and communication functionality. The power management unit 1200 can serve to protect other components of the circuitry from excess voltage and/or temperature caused by charging. Further, by enabling communication over power functionality, the power management unit 1200 can reduce the number of required contacts (e.g., pins) from four (two for power and two for communication) to two (both power and communication share the same two contacts).

As noted above, some aspects of the current subject matter relates to integrated power management and heater control. In some implementations, integrated power management unit 400 can be formed as a single integrated circuit or multiple integrated circuits working together. The following description relates to example vaporizer devices within which one or more features of the current subject matter can be implemented. These example vaporizer devices are described to provide context to descriptions of features provided by the current subject matter.

FIGS. 1A-2C illustrate example vaporizer devices 100, 200 and features that may be included therein consistent with implementations of the current subject matter. FIG. 1A shows a schematic view of a vaporizer device 100 that includes a cartridge 114, and FIGS. 1B-1E show views of an exemplary vaporizer device 100 with a vaporizer device body 101 and a cartridge 114. FIGS. 1B and 1C show top views before and after connecting a cartridge 114 to a vaporizer device body 101. FIG. 1D shows an isometric perspective view of the vaporizer device 100, which includes a vaporizer device body 101 combined with a cartridge 114, and FIG. 1E shows an isometric perspective view of one variation of a cartridge 114 holding a liquid vaporizable material. In general, when a vaporizer device includes a cartridge (such as the cartridge 114), the cartridge 114 may include one or more reservoirs 120 configured to contain a vaporizable material. Any appropriate vaporizable material may be contained within the reservoir 120 of the cartridge 114, including solutions of nicotine or other organic materials as well as compositions that may include one or more neat (e.g. not dissolved in a solvent) chemical compounds, mixtures, formulations, etc.

As noted above, the vaporizer device 100 shown in FIG. 1 includes a vaporizer device body 101. As shown in FIG. 1, a vaporizer device body 101 consistent with implementations of the current subject matter may include a power source 103 (e.g. a device or system that stores electrical energy for on-demand use), which may be a battery, capacitor, a combination thereof, or the like, and which may be rechargeable or non-rechargeable. A controller 105, which may include a processor (e.g. a programmable processor, special purpose circuitry, or the like), can also be included as part of the vaporizer device body 101. The vaporizer device body 101 may include a housing that encloses one or more of the components of the vaporizer body, such as the power source 103, the controller 105, and/or any of the other components described herein as being part of such a device. In various implementations of a vaporizer device that includes a vaporizer device body 101 and a cartridge 114, the cartridge 114 may be attached on, in, or partially in the vaporizer device body 101. For example, the vaporizer device body 101 may include a cartridge receptacle 152 into which the cartridge 114 may be insertably received.

A processor of the controller 105 may include circuitry to control operation of a heater 118, which can optionally include one or more heating elements for vaporizing a vaporizable material contained within the cartridge 114, for example within a reservoir or container that is part of the cartridge 114. In various implementations, the heater 118 may be present in the vaporizer device body 101 or within the cartridge 114 (as shown in FIG. 1A), or both. The controller circuitry may include one or more clocks (oscillators), charging circuitry, I/O controllers, memory, etc. Alternatively or in addition, the controller circuitry may include circuitry for one or more wireless communication modes, including Bluetooth, near-field communication (NFC), Wi-Fi, ultrasound, ZigBee, RFID, etc. The vaporizer device body 101 may also include a memory 125 that may be part of the controller 105 or otherwise in data communication with the controller. The memory 125 may include volatile (e.g. random access memory) and/or non-volatile (e.g. read-only memory, flash memory, solid state storage, a hard drive, other magnetic storage, etc.) memory or data storage.

Further with reference to FIG. 1, a vaporizer device 100 may include a charger 133 (and charging circuitry which may be controlled by the controller 105), optionally including an inductive charger and/or a plug-in charger. For example, a universal serial bus (USB) connection may be used to charge the vaporizer device 100 and/or to allow communication over a wired connection between a computing device and the controller 105. The charger 133 may charge the onboard power source 103. A vaporizer device 100 consistent with implementations of the current subject matter may also include one or more inputs 117, such as buttons, dials, or the like, a sensor 137, which may include one or more sensors such as accelerometers or other motion sensors, pressure sensors (e.g. relative and/or absolute pressure sensors, which may be capacitive, semiconductor-based, etc.), flow sensors, or the like. One more such sensors 137 may be used by the vaporizer device 100 to detect user handling and interaction. For example, detection of a rapid movement (such as a shaking motion) of the vaporizer device 100 may be interpreted by the controller 105 (e.g. through receipt of a signal from one or more of the sensors 137) as a user command to begin communication with a user device that is part of a vaporizer system and that can be used for controlling one or more operations and/or parameters of the vaporizer device 100 as described in more detail below. Additionally or alternatively, detection of a rapid movement (such as a shaking motion) of the vaporizer device 100 may be interpreted by the controller 105 (e.g. through receipt of a signal from one or more of the sensors 137) as a user command to cycle through a plurality of temperature settings to which the vaporizable material held within the cartridge 114 is to be heated by action of the heater 118. In some optional variations, detection of removal of the cartridge 114 by the controller 105 (e.g. through receipt of a signal from one or more of the sensors 137) during a cycling-through of the plurality of temperature settings may act to establish the temperature (e.g., when the cycle is at a desired temperature, a user may remove the cartridge 114 to set the desired temperature). The cartridge 114 may then be re-engaged with the vaporizer device body 101 by the user to allow use of the vaporizer device 100 with the heater controlled by the controller 105 consistent with the selected temperature setting. The plurality of temperature settings may be indicated through one or more indicators on the vaporizer device body 101. A pressure sensor can, as noted above, be used in detection of any of a start, an end, or a continuation of a puff.

A vaporizer device 100 consistent with implementations of the current subject matter may also include one or more outputs 115. Outputs 115 as used herein can refer to any of optical (e.g., LEDs, displays, etc.), tactile (e.g., vibrational, etc.), or sonic (e.g., piezoelectric, etc.) feedback components, or the like, or some combination thereof.

A vaporizer device 100 consistent with implementations of the current subject that includes a cartridge 114 may include one or more electrical contacts (e.g., pins, plates, sockets, mating receptacles or other features for coupling electrically with other contacts, etc.), such as the vaporizer device body electrical contacts 109, 111, 113 shown in FIG. 1A) on or within the vaporizer device body 101 that may engage complementary cartridge contacts 119, 121, 123 (e.g., pins, plates, sockets, mating receptacles or other features for coupling electrically with other contacts, etc.) on the cartridge 114 when the cartridge is engaged with the vaporizer device body 101. The contacts on the vaporizer body 101 are generally referred to herein as "vaporizer body contacts" and those on the cartridge 114 are generally referred herein to as "cartridge contacts." These contacts may be used to provide energy from the power source 103 to the heater 118 in implementations of the current subject matter in which the heater 118 is included in the cartridge 114. For example, when the cartridge contacts and the vaporizer body contacts are respectively engaged by coupling of the cartridge 114 with the vaporizer device body 101, an electrical circuit can be formed allowing control of power flow from the power source 103 in the vaporizer device body 101 to the heater 118 in the cartridge 114. A controller 105 in the vaporizer device body 101 can regulate this power flow to control a temperature at which the heater 118 heats a vaporizable material contained in the cartridge 114.

While three vaporizer device body contacts 109, 111, 113 and three cartridge contacts 119, 121, 123 are shown, certain implementations of the current subject matter may use only two of each type of contacts to complete an electrical circuit that can be used for power delivery from the power source 103 to the heater 118 and optionally also for measuring a temperature of a heating element in the heater (e.g. by briefly and intermittently interrupting a flow of current to the heating element, measuring a resistance of the heating element during these brief interruptions, and using a thermal resistance coefficient to obtain temperature from the measured resistance) and/or transmitting data between an optional identifier 138 and the controller 105. Alternatively or in addition, additional contacts (e.g. optional contacts 113 and 123) may be included for data passing, temperature measurements, pressure sensor measurements (e.g. if a pressure sensor is included on the cartridge while the controller 105 is in the vaporizer device body 101).

An airflow path (150, in FIG. 1E) can direct air to the heater, where the air is combined with vaporized vaporizable material from a reservoir 120 such that an inhalable aerosol is generated for delivery to a user via a mouthpiece 144, which can also be part of the cartridge 114. The airflow path 150 may, in some examples, pass between an outer surface of the cartridge 114 and an inner surface of a cartridge receptacle on the vaporizer device body 101 as described further below.

Any compatible electrical contact may be used, including pins (e.g., pogo pins), plates, and the like. In addition, as described below, in some implementations of the current subject matter one-way or two-way communication is provided between the vaporizer device body 101 and the cartridge 114 through one or more electrical contacts, which may include the electrical contacts used to provide energy from the power source 103 to the heater 118, which may include a heating element such as a resistive heating element. The cartridge 114 and the vaporizer device body 101 may be removably coupled together, e.g., by engaging a portion of a housing of the cartridge 114 with the vaporizer device body 101 and/or the vaporizer housing in a mechanical connection (e.g., a snap and/or friction fit). Alternatively or additionally, the cartridge 114 and the vaporizer device body 101 may be coupled magnetically or via some other coupling or engaging mechanism. Other connection types are also within the scope of the current subject matter, as are combinations of two or more connection types.

FIGS. 1B to 1F illustrate an example of a vaporizer 100 with a vaporizer device body 101 and cartridge 114. The two are shown unconnected in FIG. 1B and connected in FIG. 1C. FIG. 1D shows an isometric perspective view of the combined vaporizer device body 101 and cartridge 114, and FIG. 1E and FIG. 1F shows an individual cartridge 114 from two different views. FIGS. 1B-1F in combination illustrate an example cartridge-based vaporizer device including many of the features generally shown in FIG. 1A. Other configurations, including some or all of the features described herein, are also within the scope of the current subject matter. FIG. 1D shows a vaporizer device 100 having a cartridge 114 coupled into a cartridge receptacle 152 of the vaporizer device body 101. In some implementations of the current subject matter, the reservoir 120 may be formed in whole or in part from translucent material such that a level of the vaporizable material is visible from a window 158. The cartridge 114 and/or the vaporizer device body 101 may be configured such that the window 158 remains visible when the cartridge 114 is insertably received by the cartridge receptacle 152. For example, in one exemplary configuration, the window 158 may be disposed between a bottom edge of the mouthpiece 144 and a top edge of the vaporizer device body 101 when the cartridge 114 is coupled with the cartridge receptacle 152.

FIG. 1E illustrates an example of an airflow path 150 for air to be drawn by a user puff from outside of the cartridge 114 past the heater 118 (e.g. through a vaporization chamber that includes or contains the heater 118, and on to the mouthpiece 144 for delivery of the inhalable aerosol. The mouthpiece may optionally have multiple openings through which the inhalable aerosol is delivered. For example, a cartridge receptacle 152 may be present at one end of a vaporizer device body 101, such that an insertable end 154 of the cartridge 114 may be insertably received into the cartridge receptacle 152. When the cartridge insertable end 154 is fully inserted into the cartridge receptacle 152, an inner surface of the cartridge receptacle 152 forms one surface of part of the airflow path 150 and an exterior surface of the cartridge insertable end 154 forms another surface of that part of the airflow path.

As shown in FIG. 1E, this configuration causes air to flow down around the cartridge insertable end 154 into the cartridge receptacle 152 and then back in the opposite direction after passing around the inserted end (e.g. an end opposite an end that includes the mouthpiece 144) of the cartridge 114 as it enters into the cartridge body toward the vaporization chamber and heater 118. The airflow path 150 then travels through the interior of the cartridge 114, for example via one or more tubes or internal channels to one or more outlets 156 formed in the mouthpiece 144. For a cartridge having a non-cylindrical shape 144, the mouthpiece 114 may likewise be non-cylindrical, and more than one outlets 156 may be formed in the mouthpiece, optionally arranged in a line along a longer of two transverse axes of the cartridge 114, where a longitudinal axis of the cartridge is oriented along a direction the cartridge 114 is moved to be insertably received or otherwise coupled to the vaporizer device body 101 and the two transverse axes are perpendicular to each other and to the longitudinal axis.

FIG. 1F shows additional features that may be included in a cartridge 114 consistent with the current subject matter. For example, the cartridge 114 can include two cartridge contacts 119, 121 disposed on the insertable end 154, which is configured to be inserted into the cartridge receptacle 152 of a vaporizer device body 101. These cartridge contacts 119, 121 can optionally each be part of a single piece of metal that forms a conductive structure 159, 161 connected to one of two ends of a resistive heating element. The two conductive structures can optionally form opposing sides of a heating chamber and can also act as heat shields and/or heat sinks to reduce transmission of heat to outer walls of the cartridge 114. FIG. 1F also shows a central tube 162 within the cartridge 114 that defines part of the airflow path 150 between the heating chamber formed between the two conductive structures 159, 161 and the mouthpiece 144.

As mentioned above, the cartridge 114 and optionally the vaporizer device body 101 may optionally be non-circular in cross section, with various oblong (e.g. one of two transverse axes which are orthogonal to a longitudinal axis of the vaporizer device 100 being longer than the other) cross-sectional shapes contemplated, including approximately rectangular, approximately rhomboidal, approximately triangular or trapezoidal, approximately oval in shape, etc. It will be well understood by one of ordinary skill in the art that the use of "approximately" in this context contemplates that any vertices of the cross-sectional shape need not be sharp, but can instead have a non-zero radius of curvature, and that any surfaces between such vertices need not be completely planar but can instead have a non-infinite radius of curvature.

FIGS. 2A-2C relate to an example implementation of the current subject matter in which the vaporizer device is not cartridge based. FIG. 2A shows a schematic diagram of a vaporizer device 200 that does not use a cartridge (but may still optionally accept a cartridge), but may instead (or additionally) be configured for use with a loose-leaf material or some other vaporizable material (e.g. a solid, a wax, etc.). The vaporizer device 200 in FIG. 2A may be configured to receive, in an oven 220 (e.g., a vaporization chamber), a vaporizable material such as a loose vaporizable material, a wax, and/or some other liquid or solid vaporizable material. Many elements similar to those present in the vaporizer device 100 using a cartridge 114 shown in FIG. 1A-1E may also be included as part of a vaporizer device 200 that does not require use of cartridges. For example, a vaporizer device 200 may include, in one housing, control circuitry 105 which may include power control circuitry, and/or wireless circuitry 207, and/or memory 125. A power source 103 (e.g., a battery, capacitor, etc.) within the housing may be charged by a charger 133 (and may include charging control circuitry, not shown). The vaporizer device 200 may also include one or more outputs 115 and one or more inputs 117 with sensors 137, which may include one or more of the sensors discussed above in regards to the cartridge-based vaporizer device 100. In addition, the vaporizer device 200 may include one or more heaters 118 that heat a vaporization chamber, which may be an oven 220 or other heating chamber. The heater 118 may be controlled using the resistance of the heater 118 to determine the temperature of the heater, e.g., by using the temperature coefficient of resistivity for the heater. A mouthpiece 144 may also be included in such a vaporizer device 200 for delivery of a generated inhalable aerosol to a user. FIG. 2B shows a side isometric perspective of an exemplary vaporizer device 200 with a vaporizer device body 201. In the bottom isometric perspective view of FIG. 2C, a lid 230 is shown removed from the vaporizer body 201, exposing the oven/vaporization chamber 220.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like. A computer remote from an analyzer can be linked to the analyzer over a wired or wireless network to enable data exchange between the analyzer and the remote computer (e.g. receiving data at the remote computer from the analyzer and transmitting information such as calibration data, operating parameters, software upgrades or updates, and the like) as well as remote control, diagnostics, etc. of the analyzer.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases “at least one of A, B, and C;” “one or more of A, B, and C;” and “A, B, and/or C” are each intended to mean “A alone, B alone, C alone, A and B together, A and C together, B and C together, or A and B and C together.” Use of the term “based on,” above and in the claims is intended to mean, “based at least in part on,” such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system, comprising:
- a power source;
- a connector configured to electrically couple to a heating element configured to heat vaporizable material;
- one or more sensors comprising at least one pressure sensor;
- a power management unit electrically coupled to the connector and configured to:
  - provide a flow of current to the heating element through the connector to heat the heating element, the flow of current associated with a provided electrical power;
  - intermittently interrupt the flow of current to the heating element;
  - measure, during an interruption, an electrical property of the heating element; and
  - control the flow of current to the heating element based at least in part on the electrical property; and
- a controller electrically coupled to the power management unit, the controller configured to:
  - control the provided electrical power to the power management unit based on the one or more sensors; and
  - control, over one or more input terminals interfacing with the power management unit, operation of the power management unit, wherein the one or more input terminals comprises a heat ready input configured to enable the power management unit to heat the heating element and a heater stop input configured to disable the power management unit from heating the heating element.

2. The system of claim 1, wherein the controller is further configured to detect user inhalation based on a measurement of the at least one pressure sensor, and wherein the provided electrical power is controlled based on detection of the user inhalation.

3. The system of claim 2, wherein the at least one pressure sensor comprises a cartridge pressure sensor and an ambient pressure sensor.

4. The system of claim 2, wherein the at least one pressure sensor is separate from the power management unit and separate from the controller.

5. The system of claim 4, wherein the detection of the user inhalation comprises detecting a start, an end, or a continuation of the user inhalation.

6. The system of claim 4, wherein the power management unit is formed as a single integrated circuit, and wherein the controller is separate from the single integrated circuit.

7. The system of claim 6, wherein the one or more input terminals further comprises a heat select input configured to enable selection between a current source and a load switch to drive the flow of current to the heating element and/or a pulse-width modulation (PWM) input configured to enable the load switch to vary the flow of current to the heating element.

8. The system of claim 6, wherein the controller and the power management unit are incorporated within a vaporizer device body.

9. The system of claim 8, wherein the heating element is incorporated into a cartridge connectable to the vaporizer device body.

10. The system of claim 9, wherein the connector comprises a cartridge connector configured to couple to the cartridge.

11. The system of claim 10, wherein the heating element is a resistive heating element, and wherein the electrical property comprises a resistance.

12. The system of claim 11, wherein the power management unit is further configured to determine a temperature of the resistive heating element based on the electrical property and a thermal resistance coefficient.

13. The system of claim 6, further comprising charging circuitry electrically coupled to the power source, wherein the controller is further configured to control the charging circuitry for charging the power source.

14. The system of claim 6, further comprising an antenna electrically coupled to the controller, wherein the controller comprises a wireless support system on chip (SOC) for wireless communication over the antenna.

15. The system of claim 6, wherein the power management unit comprises a measurement circuit and a field effect transistor (FET), wherein the measurement circuit and the FET are configured to provide the flow of current to the heating element and intermittently interrupt the flow of current to the heating element.

16. A vaporizer device comprising:
- a power source;
- a cartridge receptacle configured to insertably receive a cartridge comprising a heating element and a vaporizable material;
- one or more sensors comprising at least one pressure sensor;
- a power management unit configured to electrically couple to the heating element, the power management unit configured to:
  - provide a flow of current to the heating element to heat the vaporizable material, the flow of current associated with a provided electrical power;
  - intermittently interrupt the flow of current to the heating element;
  - measure, during an interruption, an electrical property of the heating element; and
  - control the flow of current to the heating element based at least in part on the electrical property; and
- a controller electrically coupled to the power management unit, the controller configured to:

control the provided electrical power to the power management unit based on the one or more sensors; and control, over one or more input terminals interfacing with the power management unit, operation of the power management unit, wherein the one or more input terminals comprises a heat ready input configured to enable the power management unit to heat the heating element and a heater stop input configured to disable the power management unit from heating the heating element.

17. The vaporizer device of claim 16, wherein the power management unit is formed as a single integrated circuit, wherein the controller and the at least one pressure sensor are separate from the single integrated circuit, and wherein the at least one pressure sensor is separate from the controller.

18. The vaporizer device of claim 17, wherein the one or more input terminals further comprises a heat select input configured to enable selection between a current source and a load switch to drive the flow of current to the heating element and/or a pulse-width modulation (PWM) input configured to enable the load switch to vary the flow of current to the heating element.

19. The vaporizer device of claim 17, wherein the heating element is a resistive heating element, wherein the electrical property comprises a resistance, and wherein the power management unit is further configured to determine a temperature of the resistive heating element based on the electrical property and a thermal resistance coefficient.

20. The vaporizer device of claim 19, wherein the controller is further configured to detect user inhalation based on a measurement of the at least one pressure sensor, wherein the provided electrical power is controlled based on detection of the user inhalation, and wherein the detection of the user inhalation comprises detecting a start, an end, or a continuation of the user inhalation.

* * * * *